United States Patent
Lederer et al.

(10) Patent No.: US 10,873,030 B2
(45) Date of Patent: Dec. 22, 2020

(54) CHARGE TRANSPORTING SEMI-CONDUCTING MATERIAL AND ELECTRONIC DEVICE COMPRISING IT

(71) Applicant: Novaled GmbH, Dresden (DE)

(72) Inventors: Kay Lederer, Dresden (DE); Steffen Runge, Dresden (DE); Jan Blochwitz-Nimoth, Dresden (DE); Felix Limberg, Munich (DE); Hartmut Krüger, Munich (DE)

(73) Assignee: Novaled GmbH, Dresden (DE)

( * ) Notice: Subject to any disclaimer, the term of this patent is extended or adjusted under 35 U.S.C. 154(b) by 107 days.

(21) Appl. No.: 16/078,416

(22) PCT Filed: Feb. 22, 2017

(86) PCT No.: PCT/EP2017/054021
§ 371 (c)(1),
(2) Date: Aug. 21, 2018

(87) PCT Pub. No.: WO2017/144516
PCT Pub. Date: Aug. 31, 2017

(65) Prior Publication Data
US 2019/0058128 A1 Feb. 21, 2019

(30) Foreign Application Priority Data
Feb. 22, 2016 (EP) .................... 16156695

(51) Int. Cl.
| | |
|---|---|
| H01L 51/00 | (2006.01) |
| C08F 226/12 | (2006.01) |
| C08F 226/02 | (2006.01) |
| H01L 51/50 | (2006.01) |
| H01L 51/56 | (2006.01) |

(52) U.S. Cl.
CPC ........ *H01L 51/0042* (2013.01); *C08F 226/02* (2013.01); *C08F 226/12* (2013.01); *H01L 51/004* (2013.01); *H01L 51/0043* (2013.01); *H01L 51/0003* (2013.01); *H01L 51/506* (2013.01); *H01L 51/5048* (2013.01); *H01L 51/56* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 4,487,667 | A * | 12/1984 | Traynor .................. | H01B 1/127 205/419 |
| 6,881,869 | B1 * | 4/2005 | Jacquot .................. | C07C 41/30 568/626 |
| 7,781,076 | B2 | 8/2010 | Shukla et al. | |
| 9,644,070 | B2 | 5/2017 | Eckes et al. | |
| 2006/0069253 | A1 * | 3/2006 | Fischer ................... | A01N 43/84 544/106 |
| 2015/0108408 | A1 * | 4/2015 | Eckes .................... | C08G 61/12 252/500 |

FOREIGN PATENT DOCUMENTS

WO    2016/026806 A1    2/2016

OTHER PUBLICATIONS

PCT International Search Report and Written Opinion for PCT Application No. PCT/EP2017/054021 dated Mar. 21, 2017 (11 pages).
Chinese Office Action for CN Application No. 201780012461.2 dated Mar. 3, 2020 (English translation, 18 pages).

* cited by examiner

Primary Examiner — Katie L. Hammer
(74) Attorney, Agent, or Firm — Eversheds Sutherland (US) LLP

(57) ABSTRACT

The present invention relates to a charge transporting semi-conducting material comprising: a) at least one electrical dopant, and b) a branched or cross-linked charge-transporting polymer comprising cyclobutenone cross-linking units of at least one of the general formulae Ia and/or Ib, wherein aa) $Pol^1$, $Pol^2$, $Pol^3$ and $Pol^4$ are independently selected chains of the charge-transporting polymer, bb) $X^1$, $X^2$, $X^3$, and $X^4$ are independently selected optional spacer units or, independently, represent direct bonding of $Pol^1$, $Pol^2$, $Pol^3$ and $Pol^4$ chains to the cyclobutenone ring, cc) $Z^1$, $Z^2$, $Z^3$, and $Z^4$ are independently selected from H, halogen or a carbon-containing group; the charge transporting semi-conducting material being obtainable by a process comprising: i) providing a solution containing aaa) at least one precursor charge transporting compound comprising at least one covalently attacked alkenyloxy group having generic formula II wherein X is an optional spacer which is further linked to a charge transporting structural moiety of the precursor charge transporting compound, the dashed line represents the bonding to a charge transporting structural moiety of the precursor charge transporting compound and $Z^1$, $Z^2$, $Z^3$, and $Z^4$ are independently selected from H, halogen or the carbon-containing group, bbb) at least one electrical dopant, ccc) at least one solvent, ii) depositing the solution on a substrate, iii) removing the solvent, and iv) reacting the alkinyloxy groups to effect crosslinking, preferably by heating, wherein the average number of the alkinyloxy groups per one molecule of the precursor charge transporting compound provided in the step i) is equal to or greater than 2, preferably greater than 2.05, and a process for preparing the same.

21 Claims, 1 Drawing Sheet

CHARGE TRANSPORTING SEMI-CONDUCTING MATERIAL AND ELECTRONIC DEVICE COMPRISING IT

CROSS REFERENCE TO RELATED APPLICATIONS

Figure 1:
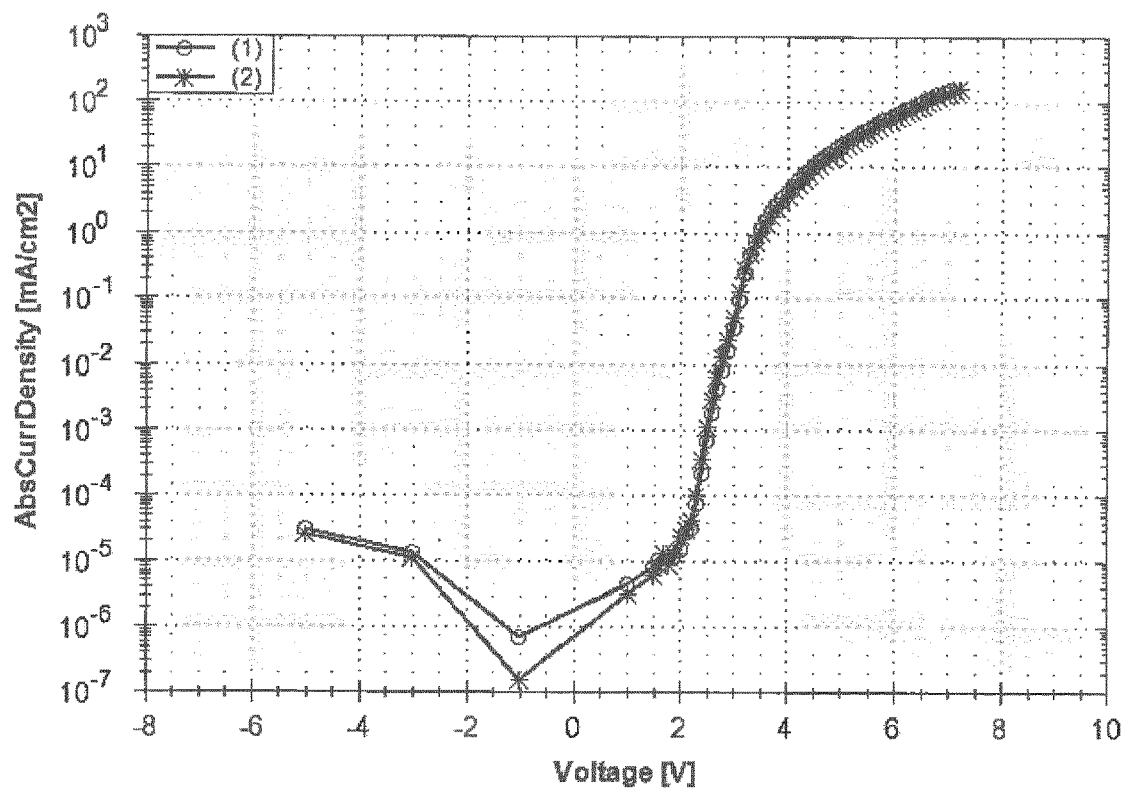

This application is a U.S. national stage application of PCT/EP2017/054021, filed Feb. 22, 2017, which claims priority to European Application No. 16156695.5, filed Feb. 22, 2016. The content of these applications is incorporated herein by reference.

The present invention relates to a charge transporting semi-conducting material, a method for its preparation and a semiconducting device comprising the material.

Since the demonstration of low operating voltages by Tang et al., 1987 [C. W. Tang et al. Appl. Phys. Lett. 51 (12) 913 (1987)], organic light-emitting diodes have been promising candidates for the realization of large-area displays. They consist of a sequence of thin (typically 1 nm to 1 μm) layers of organic materials, which can be produced by vacuum deposition, by spin-on deposition or by deposition from solution in their polymer form. After electrical contacting by metallic layers they form a great variety of electronic or optoelectronic components, such as for example diodes, light-emitting diodes, photodiodes and thin film transistors (TFT), which, in twits of properties, compete with established components based on inorganic layers.

In the case of organic light-emitting diodes (OLEDs), light is produced and emitted by the light-emitting diode by the injection of charge carriers (electrons from one side, holes from the other) from the contacts into adjacent organic layers as a result of an externally applied voltage, subsequent formation of excitons (electron-hole pairs) in an active zone, and radiant recombination of these excitons.

The advantage of such organic components as compared with conventional inorganic components (semiconductors such as silicon, gallium arsenide) is that it is possible to produce large-area elements, i.e., large display elements (visual displays, screens). Organic starting materials, as compared with inorganic materials, are relatively inexpensive (less expenditure of material and energy). Moreover, these materials, because of their low processing temperature as compared with inorganic materials, can be deposited on flexible substrates, what opens up a whole series of new applications in display and illuminating engineering.

The basic construction of such a component includes an arrangement of one or more of the following layers:
1. Carrier, substrate
2. Base electrode, hole-injecting (positive pole), usually transparent
3. Hole-injecting layer
4. Hole-transporting layer (HTL)
5. Light-emitting layer (EL)
6. Electron-transporting layer (ETL)
7. Electron-injecting layer
8. Cover electrode, usually a metal with low work function, electron-injecting (negative pole)
9. Encapsulation, to shut out ambient influences.

While the foregoing represents the most typical case, often several layers may be (with the exception of the $2^{nd}$, $5^{th}$ and $8^{th}$ layers) omitted, or else one layer may combine several properties. U.S. Pat. No. 5,093,698 discloses that the hole-conducting and/or the electron-conducting layer may be doped with other organic molecules, in order to increase their conductivity.

Organic photovoltaics (OPV) offer a big promise for the efficient and large scale conversion of light into electricity. The production of organic photovoltaic devices is less material demanding than the production of inorganic crystalline photovoltaic devices. The production also consumes considerably less energy than the production of any other inorganic photovoltaic device.

Efficiency of organic photovoltaic devices has been improving steadily. In 2008 a certified power conversion efficiency value of 5% was reached, and in 2010 the psychological barrier of 8% was broken, aligning the efficiency of the organic photovoltaic devices to typical values of amorphous Si devices.

OPV devices comprise at least one solar cell, or an arrangement of solar cells. Organic solar cells have the most different layer stack architectures. Typically they comprise at least one organic photovoltaic layer between two electrodes. That organic layer can be a blend of a donor and an acceptor such as P3HT (poly3-hexyl-tiophene) and PCBM (phenyl C61 Butyric Acid Methyl Ester). Such simple device structures only achieve reasonably efficiencies if interfacial injection layers are used to facilitate charge carrier injection/extraction (Liao et al., Appl. Phys. Lett., 2008. 92: p. 173303). Other org c solar cells have multi-layer structures, sometimes even hybrid polymer and small molecule structures. Also tandem or multi-unit stacks are known (U.S. Pat. No. 7,675,057, or Ameri, et al., Energy & Env. Science, 2009. 2: p. 347). Multi-layer devices can be easier optimized since different layers can comprise different materials which are suitable for different functions. Typical functional layers are transport layers, optically active layers, injection layers, etc.

The use of doped charge-carrier transport layers (p-doping of the HTL by admixture of acceptor-like molecules, n-doping of the ETL by admixture of donor-like molecules) is described in U.S. Pat. No. 5,093,698. Doping in this sense means that the admixture of doping substances into the layer increases the equilibrium charge-carrier concentration in this layer, compared with the pure layers of one of the two substances concerned, which results in improved conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier density, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material.

An important property of organic semi-conducting devices is their conductivity. By electrical doping, the conductivity of a layer of an organic semi-conducting device can be significantly increased. The conductivity of a thin layer sample can be measured by, for example, the so called two-point method. At this, a voltage is applied to the thin layer and the current flowing through the layer is measured.

The resistance, respectively the conductivity, results by considering the geometry of the contacts and the thickness of the layer of the sample.

In fields of organic electronics, several different functional organic layers have to be formed on top of each other to produce an electronic device. The function of the device results from the optimized interaction of the stacked layers and their interfaces. In general, there are two different approaches for preparing these layers and interfaces. First, vacuum deposition and, second, coating of the functional material from a solution on the top of substrate or of another layer prepared before.

From these technologies, solution processes gain rising attention due to their potential for a high throughput mass production and lower costs in comparison with high vacuum technologies.

When using solution processes, there is the challenge of avoiding damage or dissolving previous organic layer and/or any undesirable change of properties of the previous layer by depositing another layer on top of the previous layer from a solvent. Besides the so called "orthogonal solvent" approach, crosslinking of the previous organic layer is another option for preventing damage, dissolution or another undesirable change of the previous layer.

A previous application published as WO2014/037512 and incorporated herein by the reference describes successful combination of azide+acetylene cycloaddition cross-linking with electrical doping.

It is an object of the present invention to provide cross-linked charge transporting semi-conducting materials with improved properties, intermediates and process for the preparation of such improved materials, and devices exploiting the improved material for better performance.

This object has been achieved by a charge transporting semi-conducting material comprising:
a) at least one electrical dopant, and
b) at least one branched or cross-linked charge-transporting polymer comprising cyclobutenone cross-linking units of at least one of the general formulae Ia and/or Ib,

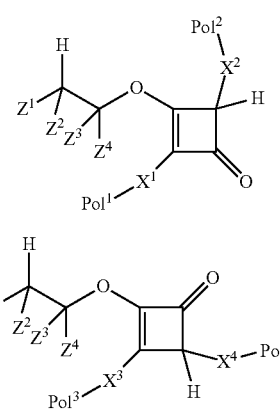

wherein
aa) $Pol^1$, $Pol^2$, $Pol^3$ and $Pol^4$ are independently selected chains of the charge-transporting polymer,
bb) $X^1$, $X^2$, $X^3$, and $X^4$ are independently selected optional spacer units or, independently, represent direct bonding of the $Pol^1$, $Pol^2$, $Pol^3$ and $Pol^4$ chains to the cyclobutenone ring,
cc) $Z^1$, $Z^2$, $Z^3$, and $Z^4$ are independently H, halogen and a carbon-containing group, the charge transporting semi-conducting material being obtainable by a process comprising:
i) providing a solution containing
aaa) at least one precursor charge transporting compound comprising at least one covalently attached alkinyloxy group having generic formula II

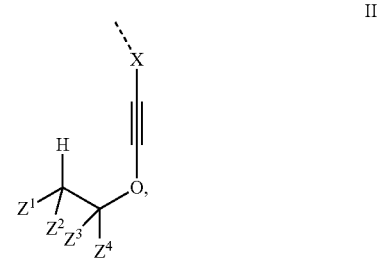

wherein
X is the optional spacer which is further linked to a charge transporting structural moiety of the precursor charge transporting compound, the dashed line represents the bonding to a charge transporting structural moiety of the precursor charge transport compound and
$Z^1$, $Z^2$, $Z^3$, and $Z^4$ are independently selected from H, halogen or the carbon-containing group,
bbb) at least one electrical dopant,
ccc) at least one solvent,
ii) depositing the solution on a substrate,
iii) removing the solvent, and
iv) reacting the alkinyloxy groups to effect crosslinking, preferably by heating,
wherein the average number of the alkinyloxy groups having formula II per one molecule of the precursor charge transporting compound provided in the step i) is equal to or greater than 2, preferably greater than 2.05.

Preferably, $Z^1$, $Z^2$, $Z^3$, and $Z^4$ are independently selected from the group consisting of
H, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl,
$C_2$-$C_{13}$ heteroaryl having up to three heteroatoms, independently selected from oxygen, nitrogen and sulphur,
$C_1$-$C_{22}$ saturated or unsaturated alkoxy, $C_3$-$C_{22}$ cycloalkyloxy, $C_6$-$C_{18}$ aryloxy, $C_7$-$C_{22}$ arylalkyloxy,
$OSiR^1R^2R^3$, wherein $R^1$, $R^2$ and $R^3$ are independently selected from $C_1$-$C_4$ alkyl or phenyl,
$COR^4$ or $COOR^5$, wherein $R^4$ and $R^5$ are independently selected from $C_1$-$C_{22}$ alkyl or $C_7$-$C_{22}$ arylalkyl,
$CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl.

It is to be understood that if any of $Z^1$, $Z^2$, $Z^3$, and $Z^4$ is a hydrocarbon group or comprises a hydrocarbon part, its carbon atoms can be optionally substituted by alkyl, cycloalkyl, aryl, heteroaryl or arylalkyl, in which the number of C-atoms, stated under cc), includes the number of C-atoms of the substituents, and the group can be optionally partially or fully substituted by halogen atoms. It is also to be understood that two independently selected substituents $Z^1$, $Z^2$, $Z^3$, and $Z^4$ can be linked together to form a ring.

Under charge transporting structural moiety, it is to be understood a structural moiety, comprising a system of at least two electrons, delocalized over at least three atoms having preferably higher atomic number than one. Preferably, the system of delocalized electrons comprises at least four electrons, more preferably at least six electrons, even more preferably at least eight electrons, most preferably at least ten electrons.

In one embodiment, the precursor charge transporting compound is a precursor charge transporting polymer.

In one embodiment, the charge transporting structural moiety may be the backbone of the precursor charge transporting polymer or a structural moiety in the charge transport polymer backbone.

In another embodiment, the charge transporting structural moiety may be comprised in a group pending on a charge transport polymer.

In one embodiment, the polymer bearing the pending groups which comprise the charge transporting structural moieties comprises ethylene building units in the backbone.

In one embodiment, the ethylene building unit is substituted with at least one pending side group comprising at least one charge transporting structural moiety.

In another embodiment, the precursor charge transporting compound is a precursor charge transporting oligomer or a precursor charge transporting small molecule.

Preferably, the charge transporting structural moiety comprises a conjugated system of at least 4, more preferably at least 6, even more preferably at least 8, most preferably at least 10, delocalized electrons.

In one of preferred embodiments, the charge transporting structural moiety comprises an aromatic system of delocalized electrons.

Also preferably, the charge transporting structural moiety is comprised in a carbocyclic or heterocyclic structural moiety.

In one embodiment, the carbocyclic or heterocyclic structural moiety comprises at least two rings which are independently selected from aromatic and heteroaromatic rings.

In another embodiment, the system of delocalized electrons comprises a lone electron pair of at least one trivalent nitrogen atom.

In one of preferred embodiments, the trivalent nitrogen atom is substituted with three carbocyclic or heterocyclic rings which are independently selected from aromatic and heteroaromatic rings.

In one embodiment, the charge transporting structural moiety is selected from

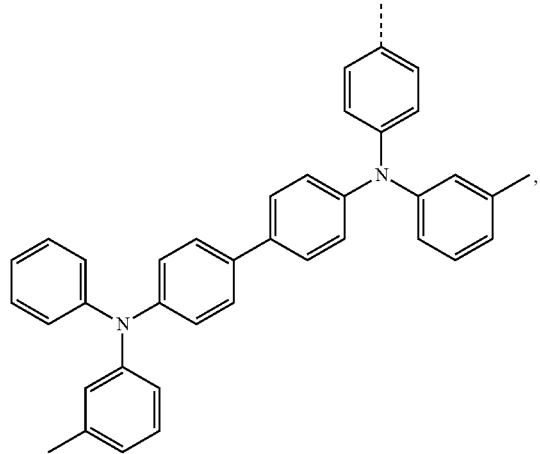

wherein the dashed line represents the covalent bond to the rest of the precursor charge transporting compound and/or to the rest of the charge transporting polymer.

In still another embodiment, any of $Z^1$, $Z^2$, $Z^3$, and $Z^4$ may comprise at least one charge transporting structural moiety, or be linked to a charge transporting polymer.

The electrical dopant is being understood as a compound introduced in a semiconductor for the purpose of modulating its electrical properties, preferably for increasing its conductivity. Preferably, the electrical dopant is a redox dopant which creates in the doped semiconducting material free charge carriers having character of ion radicals (holes) by means of redox reaction (charge transfer) with the charge transporting matrix. In one embodiment, the electrical dopant is a redox p-dopant, the charge carrier has character of a cation radical ("hole" in semiconductor terminology) and charge carrier transport is hole transport. In another embodiment the electrical dopant is a redox n-dopant, the charge carrier has character of an anion radical ("free electron" in semiconductor terminology) and charge carrier transport is electron transport.

The strength of redox dopants can be compared e.g. in terms of their electrochemical redox potential, which can be measured by cyclic voltammetry in presence of a reference redox system, for example $Fc/Fc^+$. Details of cyclovoltammetry and other methods to determine reduction potentials and the relation of the ferrocene/ferrocenium reference couple to various reference electrodes can be found in A. J. Bard et al., "Electrochemical Methods: Fundamentals and Applications", Wiley, 2. Edition, 2000.

A spacer unit in terms of the present invention is a structural moiety allowing connection of two molecular groups, preferably via covalent bonding. In general, any covalent structure, stable enough to withstand conditions of crosslinking process, can be used as a spacer unit. The term "structural moiety" is used for any part of a more complex chemical structure.

Preferably, spacer units having up to 30 multivalent atoms can be used. Even more preferred, the spacer unit is a molecular group only comprising covalent bonds. The spacer having up to 30 multivalent atoms does not need to contribute itself to the charge-transporting properties of the charge transporting semi-conducting material. Spacer units comprising more than 30 multivalent atoms can be preferably used, in case that the spacer unit comprises a system of conjugated π orbitals to allow charge transfer along the spacer unit. In this case, the spacer unit can basically work in the doped semiconducting material of the invention not only in the role of a tether linking the chains of the charge transporting polymer Pol$^n$ (the terms Pol$^n$, with n being an integer from 1 to 4, and Pol will be used synonymously herein) with the cyclobutenone crosslinking unit, but, at once, together with Pol chains (Pol$^1$, Pol$^2$, Pol$^3$, Pol$^4$) of the branched or crosslinked charge-transporting polymer in the role of a charge transporting matrix without any substantial limitation in the spacer length. Multivalent in this regard means a valence higher than one. Hydrogen and alkali metals are regarded as every time monovalent, the valence of other elements depends on their bonding in the spacer in each specific case.

It is to be understood that in generic formulae Ia and Ib, the numbered symbols Pol$^n$ with n=1 to 4 represent generically individual chains of the branched or crosslinked charge-transporting polymer, similar as the numbered symbols X represent generically individual spacer units introduced by reaction of precursor compounds comprising the alkinyloxy groups having formula H.

The overall amount of the spacer unit in the charge transporting semi-conducting material should not exceed 90% by weight, preferably 80% by weight, most preferably 50% by weight, with regard to the overall weight of the charge transporting semi-conducting material.

Saturated alkyl comprises all linear and branched alkyl groups, only containing carbon-carbon single bonds. Unsaturated alkyl is a linear or branched hydrocarbon group comprising at least one carbon-carbon double bond.

Cycloalkyl in terms of the present invention includes all cyclic and polycyclic carbon structures, which can optionally also contain unsaturated bonds with exception of aromatic systems (aryls).

The term aryl includes also aryl groups substituted by alkyl groups, like tolyl, xylyl, etc. It further includes all kind of condensed aromatic systems like naphthyl, antracene-yl, phenanthrene-yl and aryl substituted aryls like 1,1'-biphenyl-4-yl.

Halogen means F, Cl, Br and I.

Cross-linking in terms of the present invention means to link polymer chains to form an infinite structure, preferably by new covalent bonds forming new (crosslinking) structural moieties (crosslinking units). Basically, it is necessary to have at least two crosslinkable reactive groups per molecule in the crosslinking reaction mixture, to be able to achieve a continuous infinite network during crosslinking reaction from starting molecules linked together with new crosslinking units formed from the starting crosslinkable reactive groups. The term "infinite" means that the network forms a huge polymer molecule which size is only limited by the total amount of precursor materials. The higher the average number of the reactive groups per molecule is, the lower is the conversion of functional groups to crosslinking groups, needed to form the infinite network (gelation point). A person skilled in the art will be aware that an increased number of cross-linking units in the cross-linked charge transporting material can be particularly advantageous to achieve a layer of high stability, especially of high resistance against damage by any solvent used in processing of an adjacent layer.

In the crosslinked charge transporting polymer according to the invention, binding of each crosslinking cyclobutenone unit can be to the same chain or to different chains of the charge transporting polymer Pol. Each Pol chain is bound at least to one cyclobutenone crosslinking unit. If the charge transporting polymer according to the invention does not form an infinite structure, the average number of the Pol chains linked directly or through the spacer to one crosslinking cyclobutenone group as well as the average number of the crosslinking cyclobutenone groups connected directly or through the spacer to one Pol chain are less than two. Such charge transporting polymer is branched but not yet crosslinked.

A charge transporting polymer in terms of the present invention is a polymer capable to transport an injected charge owing to a system of overlapping orbitals along the polymer chain. In charge transporting polymers of the present invention, the overlapping orbitals are preferably orbitals of the atoms contained in the pending side groups along the polymeric backbone, but can also be orbitals of atoms in the polymer backbone. Injecting charge (either in form of electron injected or withdrawn by an electrode in contact with the polymer or through a reaction with a proper electrical dopant) can, thus, form a delocalized cation radical or anion radical, able to easily migrate through the polymeric material and thus create measurable currents if an electric voltage is applied.

Preferably, the charge transporting semi-conducting material has an electric conductivity higher than $10^{-10}$ S/cm, preferably higher than $10^{-8}$ S/cm, more preferably higher than $10^{-6}$ S/cm, most preferably higher than $10^{-4}$ S/cm.

The crosslinked charge transporting polymer comprising the crosslinking units of the general formulae Ia and/or Ib is obtainable by a process comprising cycloaddition reaction of alkinyloxy groups having generic formula I comprised and covalently bound in the precursor charge transporting compound.

In one embodiment of the invention, at least one precursor charge transporting compound is a precursor charge transporting polymer. Precursor charge transporting polymer is a charge transporting polymer comprising crosslinkable alkinyloxy groups having generic formula II. The precursor charge transporting polymer may be linear or branched, but may not be crosslinked, because crosslinking would have made it insoluble.

In another embodiment, at least one precursor charge transporting compound comprised in the mixture according to feature aaa) is a precursor charge transporting oligomer or a precursor charge transporting small molecule.

It is to be understood that the precursor charge transporting oligomer comprises at least two building units, each building unit comprising at least one charge transporting structural moiety. Maximum number of building units comprising the charge transporting structural moiety in the precursor charge transporting oligomer is 10, preferably 8, more preferably 7, even more preferably 6, most preferably 5.

It is to be understood that the precursor charge transporting small molecule is a compound which comprises only one charge transporting structural moiety which cannot be characterized by presence of repeating building units. It is preferred that the relative molecular weight of the precursor charge transporting small molecule is less than 2000, more preferably less than 1500, even more preferably less than 1200, most preferably less than 1000.

A building unit in terms of the present invention is a structural unit repeating in the polymer chain. Any polymer chain can be formally obtained by linking its building units together successively, like the beads of a necklace.

The building units can be the same or different and can be present in the polymer in random or regular order as well as in blocks, containing a variety of the same building units.

In one embodiment, at least one of precursor charge transporting compounds is a compound having its average functionality, defined as the average number of reactive alkinyloxy crosslinkable groups per a molecule, selected from 2, 3 or 4. In this embodiment, the crosslinkable moiety can be polymer, e.g. a linear polymer having reactive alkinyloxy end groups, or a three- or four-arm-star polymer having one reactive alkinyloxy end group at the end of each arm. In fact, it is practically unavoidable that some divalent crosslinkable moieties form by reaction with their complementary multivalent counterparts cyclic or macrocyclic structures. It can generally result in terminating the chain of crosslinked moieties started on the surface of the sample before reaching the opposite side. That means, if the average functionality of the precursor charge transporting compound is exactly equal, it is practically still not sufficient for gelation of such mixture. It is therefore preferred that the average functionality of the precursor charge transporting compound is higher than 2.05, more preferably, higher than 2.1.

On the other hand, it is obvious that if average functionality of the precursor charge transporting compound is higher than 2, not all available reactive alkinyloxy groups must necessarily convert into crosslinking cyclobutenone groups for achieving the desired infinite crosslinked network.

In one embodiment, the degree of polymerization (defined as the average number of structural units in a polymer chain) of the charge transporting precursor polymer is in the range 10-10,000, preferably in the range 20-1,000, more preferably in the range 50-500.

In one embodiment, the charge transporting precursor polymer or oligomer can be prepared by copolymerization or co-oligomerization of monomers bearing vinyl groups. In this case, resulting precursor polymers or oligomers have polyethylene or oligoethylene backbone, wherein the ethylene building units may be substituted with charge transporting structural moieties and/or alkinyloxy groups.

It is to be understood that the term substituted ethylene building units comprises e.g. phenylethylene building units which can be formed from styrene monomer. Analogously, polymers or oligomers comprising ethylene building units bearing substituents attached through a phenylene group can be prepared by addition reactions (polymerizations or oligomerizations) of styrene monomers having substituted phenyl groups.

Once prepared, the crosslinked charge transporting polymer is comprised in the charge transporting semiconducting material in form of a continuous polymeric network.

In a crosslinked polymer formed from the preferred precursor charge transporting compounds, there can be various amounts of structural units containing unreacted crosslinkable alkinyloxy groups.

In case of redox p-doping, the conductivity is provided as a result of electron transfer from HOMO of the host (hole transporting material) to the LUMO of the dopant. A suitable electrical p-dopant is generally a molecule or radical with a LUMO level equal to HOMO of the host or below it. In some cases, electrical p-dopants having LUMO level slightly above the HOMO level of the host are also applicable, but the difference of frontier orbital energies in these cases should not be higher than 0.5 eV. preferably not higher than 0.3 eV. The dopant can be neutral or electrically charged.

One class of preferred p-dopants are hexaazatriphenylene compounds. A very desirable compound for use in the p-doped organic semiconducting materials is HAT-1.

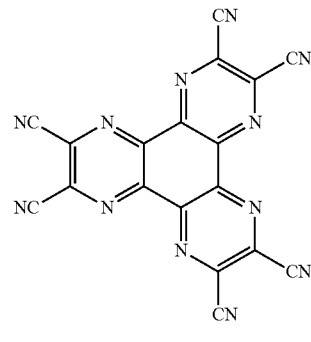

HAT-1

Another suitable class of preferred p-dopants are fluorinated derivatives of cyanobenzoquinonedimethanes and cyanobenzoquinonediimines such as those described in EP1912268, WO02007/071450 and US20060250076. Specific examples of fluorinated derivatives of cyanobenzoquinonedimethanes and cyanobenzoquinonediimines include:

TCNQ-1
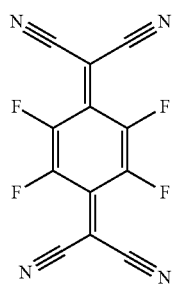

TCNQ-2
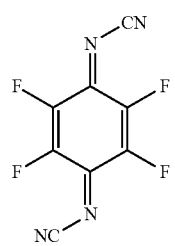

TCNQ-3
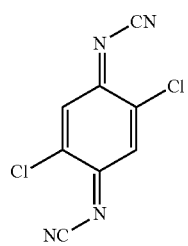

TCNQ-4
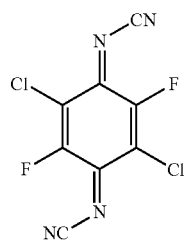

TCNQ-5
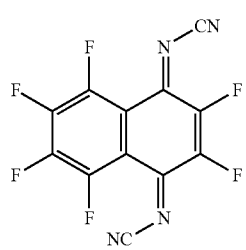

TCNQ-6
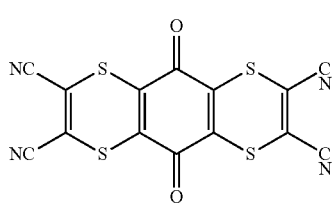

-continued

TCNQ-7
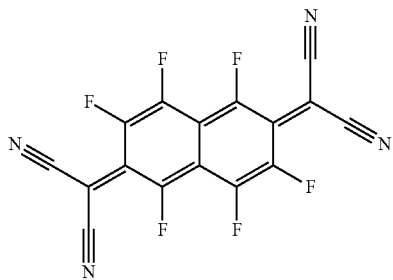

TCNQ-8
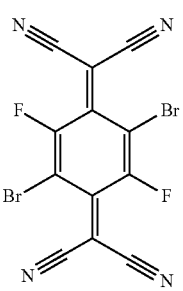

TCNQ-9
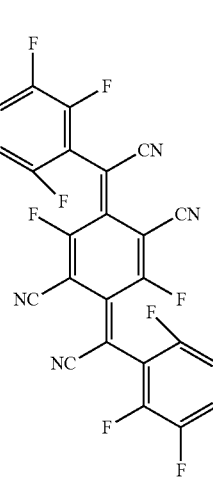

Yet another class of preferred p-dopants are radialenes such as those described in US20080265216, Iyoda et al, Organic Letters, 6(25), 4667-4670 (2004), JP3960131, Enomoto et al, Bull. Chem. Soc. Jap., 73(9), 2109-2114 (2000), Enomoto et al, Tet. Let., 38(15), 2693-2696 (1997) and Iyoda et al, JCS, Chem. Comm., (21), 1690-1692 (1989).

More preferably, the electrical dopant is selected from
(i) [3]-radialene compounds, wherein each bridgehead carbon atom is substituted by a nitrile group, $C_6$-$C_{14}$ perfluorinated aryl or $C_2$-$C_{14}$ perfluorinated heteroaryl, wherein up to three fluorine atoms in the perfluorinated substituents may optionally be replaced by groups independently selected from nitrile or trifluoromethyl, and/or
(ii) unsubstituted or substituted oxazolyl, diazolyl and/or thiazolyl radicals.

Some illustrative examples of preferred [3]-radialenes include:
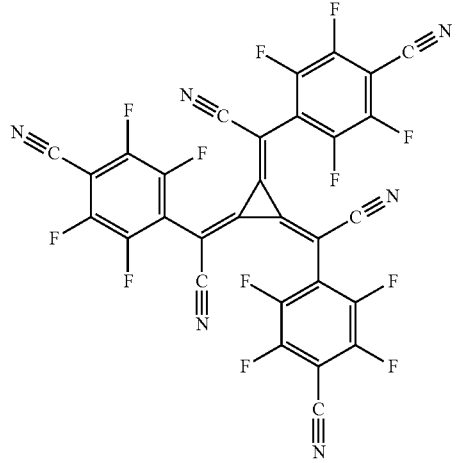
PR-1
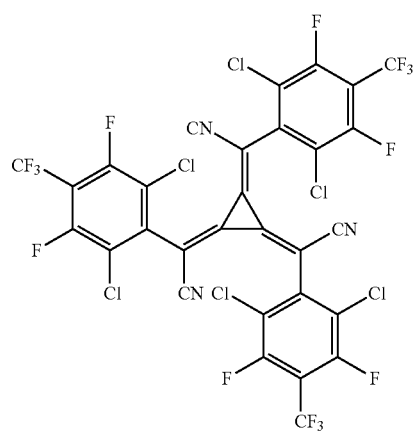
PR-2
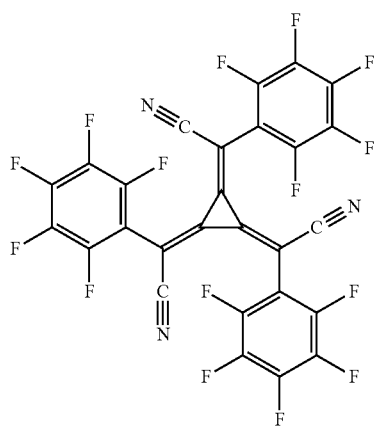
PR-3
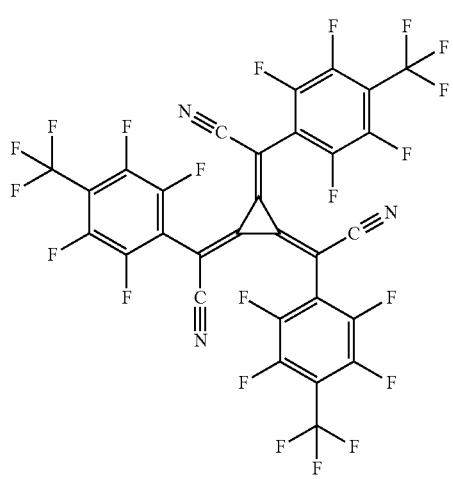
PR-4
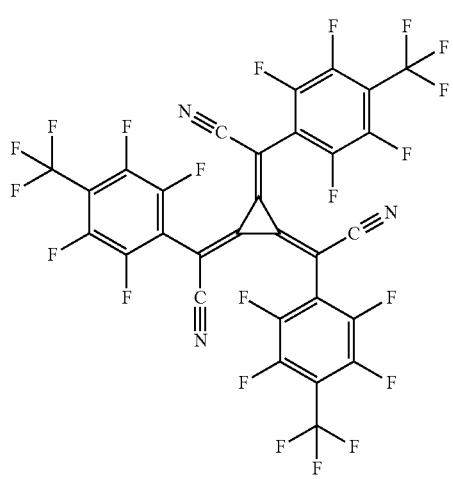
PR-5
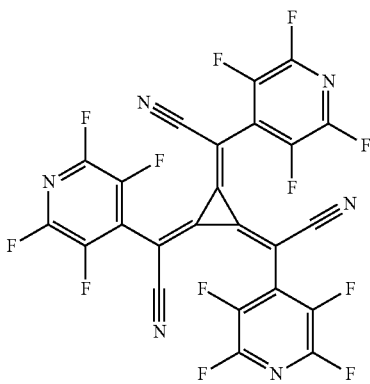
PR-6

-continued

PR-7
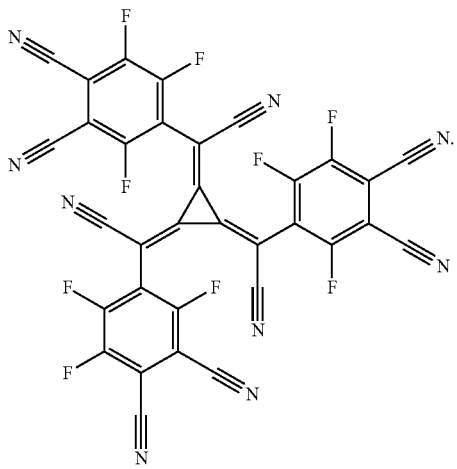

These preferred compounds were disclosed e.g. in U.S. Pat. No. 8,057,712 B2 or prepared analogously as compounds disclosed therein.

Another class of suitable p-dopants represent complexes of metals having high oxidation state, e.g.:

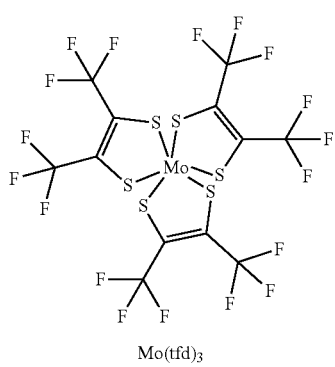

Mo(tfd)₃

Still another class of p-dopants are fullerene compounds substituted with electron withdrawing groups, as described in WO2010/029542, for example $C_{60}F_{48}$.

In case of redox n-doping, the conductivity is provided as a result of electron transfer from HOMO of the dopant to the LUMO of the matrix (electron transporting material). A suitable redox n-dopant is generally a molecule or radical with a HOMO level equal to LUMO of the matrix or above it. In some cases, electrical n-dopants having HOMO level slightly below the LUMO level of the matrix are also applicable, but the difference of frontier orbital energies in these cases should not be higher than 0.5 eV, preferably not higher than 0.3 eV. The dopant can be neutral or electrically charged.

Examples of redox n-dopants used in organic electron transport matrices are electropositive metals in their elemental form, as disclosed e.g. in WO2015/097232, WO2016/207228, WO2016/207229. Further examples of redox n-dopants are metal complexes of transition metals in low oxidation state as disclosed e.g. in WO02005/086251. Further examples of useful redox n-dopants are strongly reductive organic radicals which may be generated in situ in the doped layer from stable precursors, as disclosed e.g. in U.S. Pat. No. 8,134,146, WO2007/107306, WO2007/107356, WO2009/000237.

Preferred embodiment of such strongly reductive organic radicals are unsubstituted or substituted oxazolyl, diazolyl and/or thiazolyl radicals, more preferably, the oxazolyl, diazolyl and/or thiazolyl radicals are substituted with substituents independently selected from $C_1$-$C_{20}$ hydrocarbyl groups and overall count of carbon atoms in the substituted oxazolyl, diazolyl and/or thiazolyl radical is in the range from 4 to 104.

Exemplary dopant ND-1 used in tests has formula

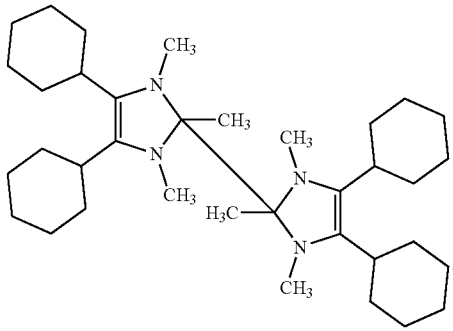

Furthermore, the object is achieved by the inventive crosslinked charge transporting polymer, comprising cyclobutenone cross-linking units of at least one of the general formulae Ia and/or Ib,

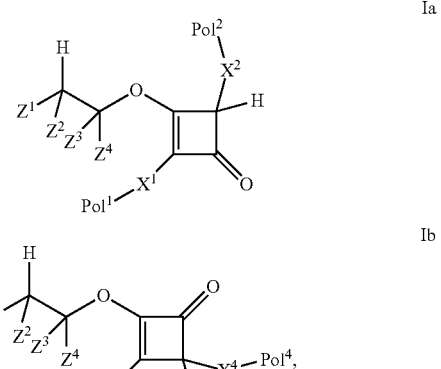

wherein aa) $Pol^1$-$Pol^4$ are independently selected chains of the charge-transporting polymer, bb) $X^1$, $X^2$, $X^3$, and $X^4$ are independently selected optional spacer units or, independently, represent direct bonding of the Pol chains to the cyclobutenone ring, cc) $Z^1$, $Z^2$, $Z^3$, and $Z^4$ are independently selected from H, halogen and a carbon-containing group, the crosslinked charge transporting polymer being obtainable by a process comprising:

i) providing a solution containing aaa) at least one precursor charge transporting compound comprising at least one covalently attached alkinyloxy groups having generic formula II

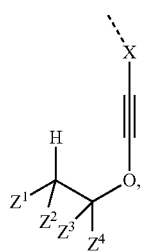

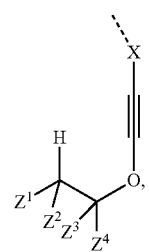

wherein

X is the optional spacer which is further linked to a charge transporting structural moiety of the precursor charge transporting compound, the dashed line represents the bonding to a charge transporting structural moiety of the precursor charge transporting compound and $Z^1$, $Z^2$, $Z^3$, and $Z^4$ are independently selected from H, halogen and a carbon-containing group, bbb) at least one solvent, ii) depositing the solution on a substrate, iii) removing the solvent, and v) reacting the alkinyloxy groups to effect crosslinking, preferably by heating, wherein the average number of the alkinyloxy groups per one molecule of the precursor charge transporting compound provided in the step i) is equal to or greater than 2, preferably greater than 2.05, and the precursor charge transporting compound is a precursor charge transporting oligomer or a precursor charge transporting small molecule.

Preferably, $Z^1$, $Z^2$, $Z^3$, and Z are independently selected from the group consisting of H, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl, $C_2$-$C_{13}$ heteroaryl having up to three heteroatoms, independently selected from oxygen, nitrogen and sulphur, $C_1$-$C_{22}$ saturated or unsaturated alkoxy, $C_3$-$C_{22}$ cycloalkyloxy, $C_6$-$C_{18}$ aryloxy, $C_7$-$C_{22}$ arylalkyloxy, $OSiR^1R^2R^3$, wherein $R^1$, $R^2$ and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^a$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl.

The object is further achieved by the process for preparing the inventive charge transporting semi-conducting material, the process comprising:

i) providing a solution containing a) a precursor charge-transporting compound comprising at least one covalently attached alkinyloxy group having formula II wherein X is the optional spacer which is further linked to a charge transporting structural moiety of the precursor charge transporting compound, the dashed line represents the bonding to the charge transporting structural moiety of the precursor charge transporting compound and $Z^1$, $Z^2$, $Z^3$, and $Z^4$ are independently selected from hydrogen, halogen or a carbon-containing group, b) at least one electrical dopant, c) at least one solvent, ii) depositing the solution on a substrate, iii) removing the solvent, and iv) reacting the alkinyloxy groups to effect crosslinking, preferably by heating, wherein the average number of the substituted alkinyloxy groups having formula II per molecule in the precursor charge transporting compound is equal to or greater than 2, preferably greater than 2.05.

Preferably, $Z^1$, $Z^2$, $Z^3$, and $Z^4$ are independently selected from the group consisting of hydrogen, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl, $C_2$-$C_{13}$ heteroaryl having up to three heteroatoms, independently selected from oxygen, nitrogen and sulphur, $C_1$-$C_{22}$ saturated or unsaturated alkoxy, $C_3$-$C_{22}$ cycloalkyloxy, $C_6$-$C_{51}$ aryloxy, $C_7$-$C_{22}$ arylalkyloxy, $OSiR^1R^2R^3$, wherein $R^1$, $R^2$ and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and $R^8$ is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl.

Preferably, the material in step iii) before reaching the gelation point will be present in form of a solid or viscoelastic material before crosslinking in step iv). Also preferably, the material forms a homogeneous thin layer. Most preferably, the layer of non-crosslinked as well as of the crosslinked polymer is amorphous.

The term "viscous material" is related to a liquid having viscosity at 25° C. higher than 1 Pa·s. Viscoelastic materials are viscous liquids which in a sufficiently short timescale show along with plasticity also elastic deformation behaviour.

There can be one starting polymer comprising crosslinkable moieties. Alternatively, the crosslinkable moieties are comprised in two or more distinct components which are mixed together during the step i). In one embodiment, one of these distinct components is the precursor charge transport polymer. In another embodiment, one of these distinct components is the precursor charge transporting oligomer or the precursor charge transporting small molecule.

Preferably, the substrate in step ii) is a layer for use in an organic electronic device, more preferably an electrode, a hole-injecting layer, a hole-transporting layer.

Basically any suitable solvent able to dissolve at least partly the precursor charge transporting compound as well as the electrical dopant can be chosen. The solubility of the least soluble component should be at least 0.5 mg/ml. For preferred precursor charge transporting compounds, as defined above, halogenated and/or aromatic hydrocarbon solvents like dichloromethane, dichloroethane, tetrachloroethane, chlorobenzene, toluene, xylene or anisol are suitable. Preferably, the solvent comprises at least 1 wt % of a nitrile compound.

In a preferred embodiment, heating in step iv) is heating to a temperature in a range from 50–180° C., more preferably 60-160° C., even more preferably 70-140° C., most preferably 80-120° C.

The object is further achieved by an electronic device comprising a semi-conducting layer comprising the inventive charge transporting semi-conducting material. The layer comprising the inventive charge transporting semi-conducting material can be made by any conventional technique like spin coating or by a proper printing technique like jet printing, screen printing or offset printing.

Furthermore, the object is achieved by a solution as defined in step i) of the inventive method containing
a) a precursor charge-transporting compound comprising at least one covalently attached alkinyloxy group having formula II

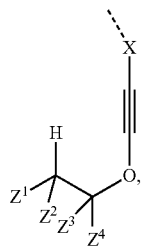

II wherein
X is the optional spacer which is further linked to a charge transporting structural moiety of the precursor charge transporting compound, the dashed line represents the bonding to the charge transporting structural moiety of the precursor charge transporting compound and Z1, Z2, Z3, and Z4 are independently selected from hydrogen, or the substituent selected from halogen and or a carbon-containing group,
b) at least one electrical dopant,
c) at least one solvent, the solvent preferably comprising at least 1 wt % of a nitrile compound.

Preferably, $Z^1$, $Z^2$, $Z^3$, and $Z^4$ are independently selected from the group consisting of hydrogen, halogen, nitrile, $C_1$-$C_{22}$ saturated or unsaturated alkyl, $C_3$-$C_{22}$ cycloalkyl, $C_6$-$C_{18}$ aryl, $C_7$-$C_{22}$ arylalkyl, $C_2$-$C_{13}$ heteroaryl having up to three heteroatoms, independently selected from oxygen, nitrogen and sulphur, $C_1$-$C_{22}$ saturated or unsaturated alkoxy, $C_3$-$C_{22}$ cycloalkyloxy, $C_6$-$C_{18}$ aryloxy, $C_7$-$C_{22}$ arylalkyloxy, $OSiR^1R^2R^3$, wherein $R^1$, $R^2$ and $R^3$ are independently selected from $C_1$-$C_4$ alkyl or phenyl, $COR^4$ or $COOR^5$, wherein $R^4$ and $R^5$ are independently selected from $C_1$-$C_{22}$ alkyl or $C_7$-$C_{22}$ arylalkyl, $CR^6R^7OR^8$, wherein $R^6$ and $R^7$ are independently selected from H, $C_1$-$C_6$ alkyl, $C_6$-$C_9$ aryl or $R^6$ and $R^7$ together form a $C_3$-$C_7$ ring, and R is $C_1$-$C_6$ alkyl, $C_7$-$C_{22}$ arylalkyl, $SiR^9R^{10}R^{11}$, wherein $R^9$, $R^{10}$, and $R^{11}$ are independently selected from $C_1$-$C_4$ alkyl or phenyl, or $COR^{12}$, wherein $R^{12}$ is H or $C_1$-$C_{21}$ alkyl.

Finally, the object is achieved by the use of the solution of the step i) of the inventive process for spin-coating, printing, casting, slot-die coating, Langmuir-Blodgett (LB) deposition, in particular as an ink for ink jet-printing.

In the following, the invention will be described in further detail, by the way of examples.

Figure 2:
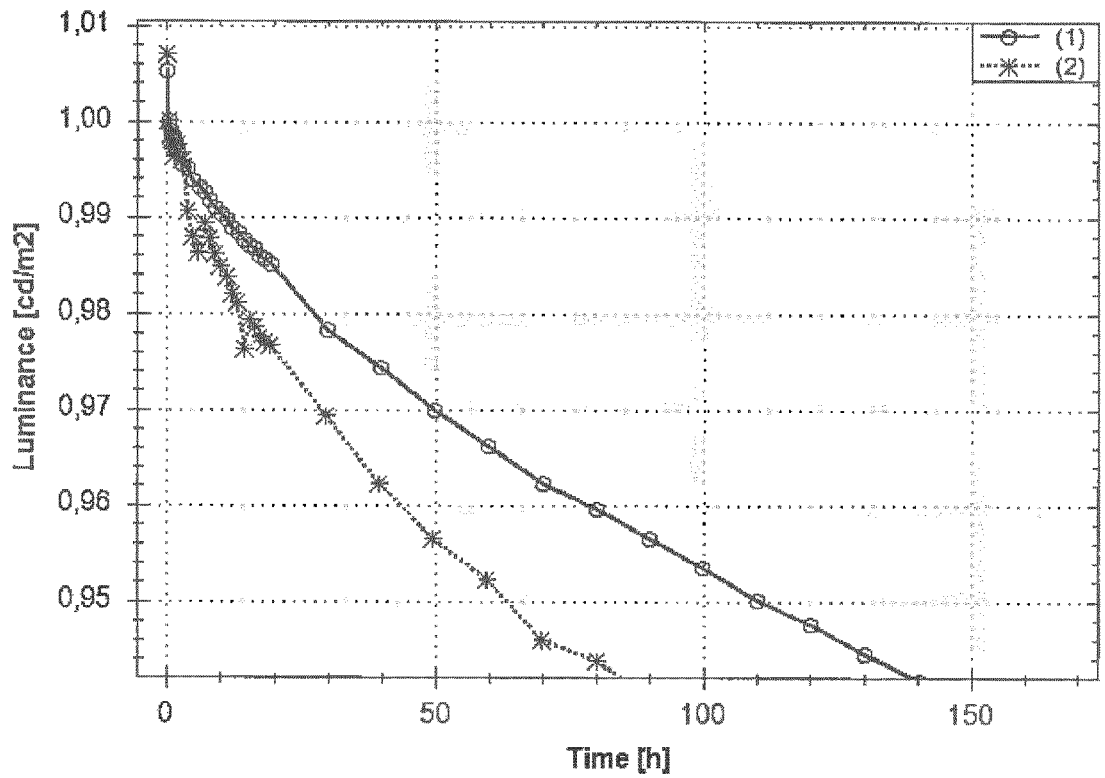

The figures show:

FIG. 1: Graph of current density of the blue OLED in dependence on the voltage;

FIG. 2: Graph of luminance of the blue OLED in dependence on time.

EXAMPLES

Several precursor charge transporting polymers and precursor charge transporting small molecules, listed in Tab. 1, were prepared and used for preparing the inventive charge transporting semiconducting material.

TABLE 1

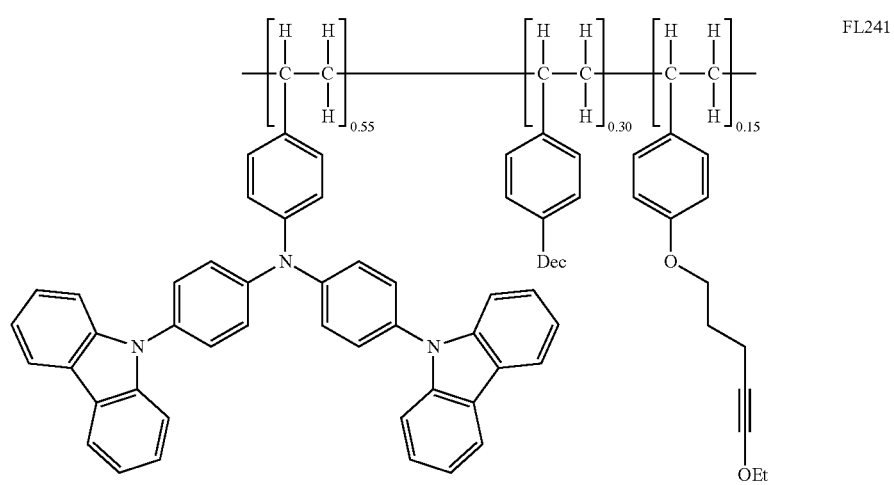

TABLE 1-continued
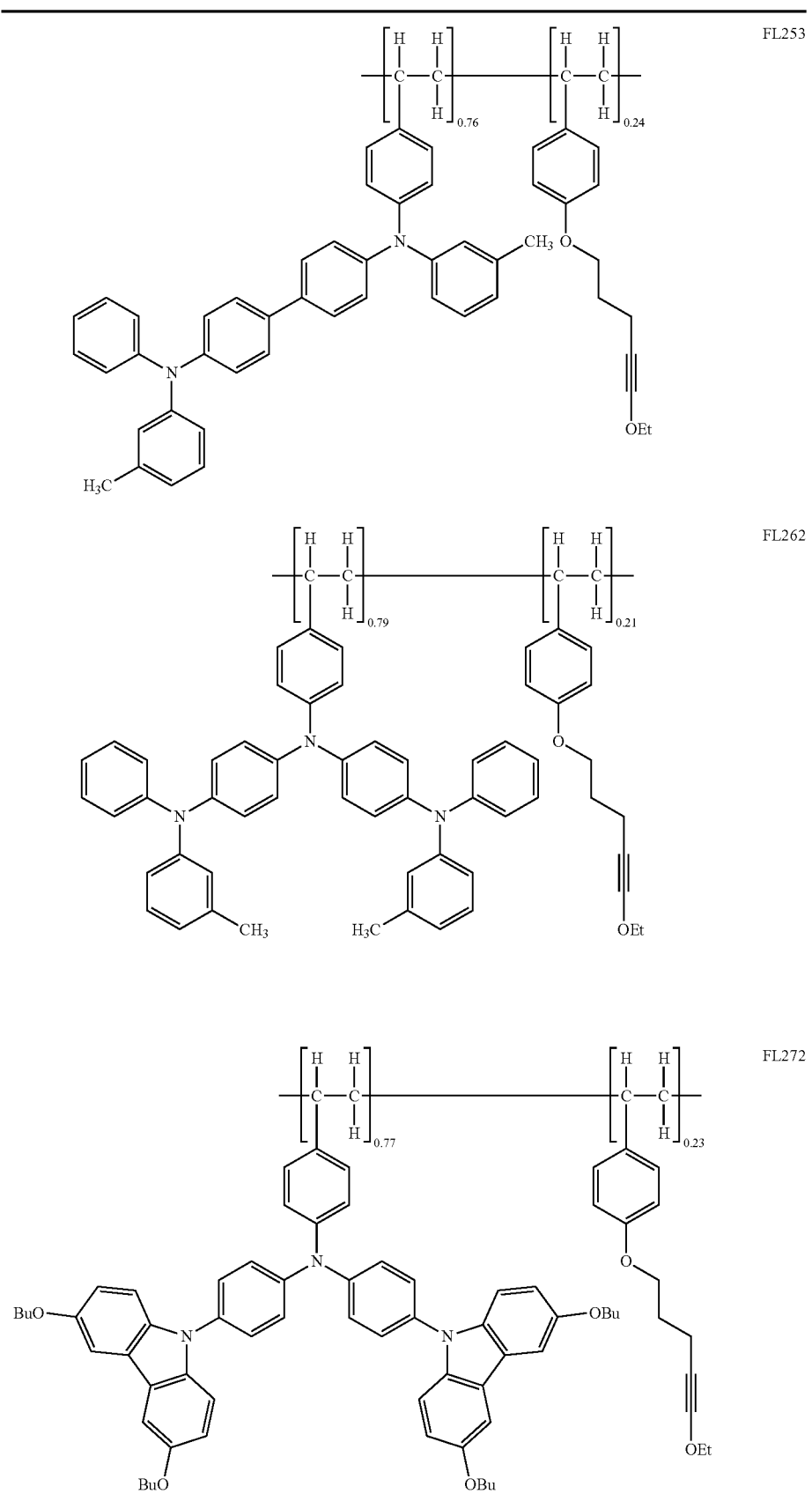

TABLE 1-continued
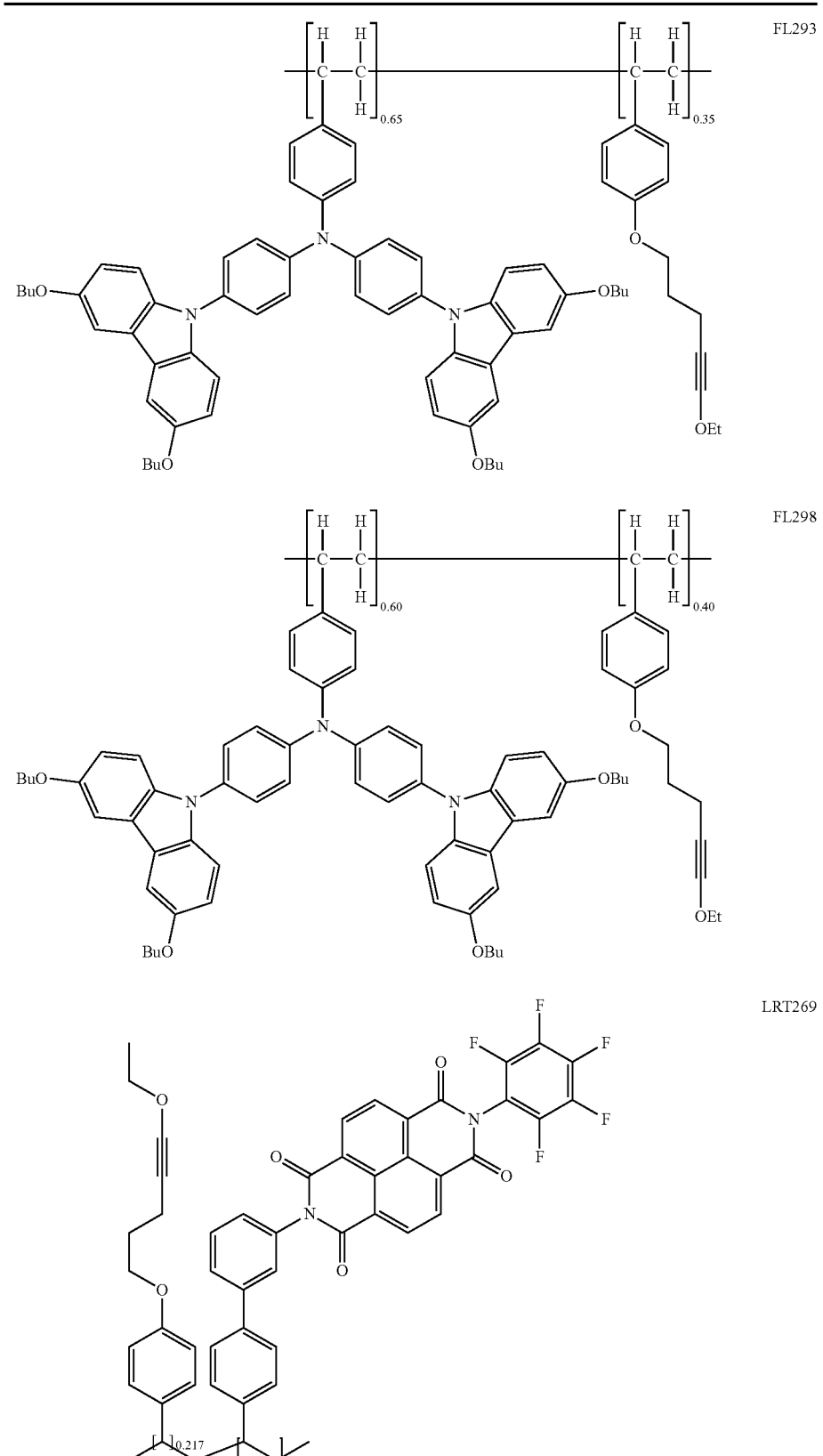

General Methods.

Gel permeation chromatography (GPC) measurements of polymer molecular weights were carried out on Agilent 1100 Series (Agilent, USA) normal-temperature size exclusion chromatograph, equipped with a refractive index detector and one column PL Gel MIXED-B (Polymer Laboratories, U.K.); the eluent was tetrahydrofuran (THF), and the flow rate was 1 mL/min. Number-average molecular weights (Mn) and polydispersity indexes (PDI) of the obtained polymers were determined based on calibration with polystyrene standards obtained from Polymer Standards Service (PSS, Germany).

Starting Materials for Polymer Preparation $N^4$-phenyl-$N^4$,$N^{4'}$-di-m-tolyl-$N^{4'}$-(4-vinylphenyl)-[1,1'-biphenyl]-4,4'-diamine (TPD-monomer), (A)

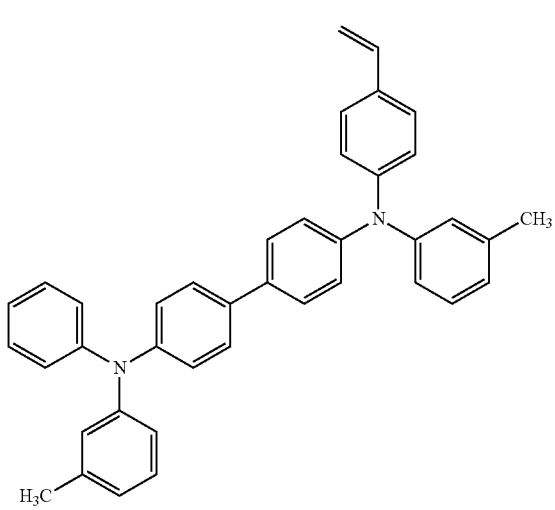 [SMILES: C=Cc1ccc(N(c2ccc(-c3ccc(N(c4ccccc4)c4cccc(C)c4)cc3)cc2)c2cccc(C)c2)cc1]

Prepared according to Thesen, M. W. et al. Hole-transporting host-polymer series consisting of triphenylamine basic structures for phosphorescent polymer light-emitting diodes. *J. Polym. Sci. Part Polym. Chem.* 48, 3417-3430 (2010). [1]

$N^1$-phenyl-$N^4$-(4-(phenyl(m-toly)amino)phenyl)-$N^1$-(m-tolyl)-$N^4$-(4-vinylphenyl)benzene-1,4-diamine (MTDATA-Monomer), (B)

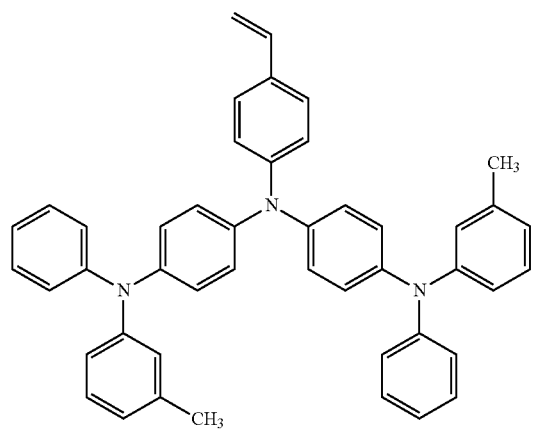 [SMILES: C=Cc1ccc(N(c2ccc(N(c3ccccc3)c3cccc(C)c3)cc2)c2ccc(N(c3ccccc3)c3cccc(C)c3)cc2)cc1]

Prepared according to [1].

N,N-bis(4-(9H-carbazole-9-yl)phenyl)-4-vinylaniline (C)

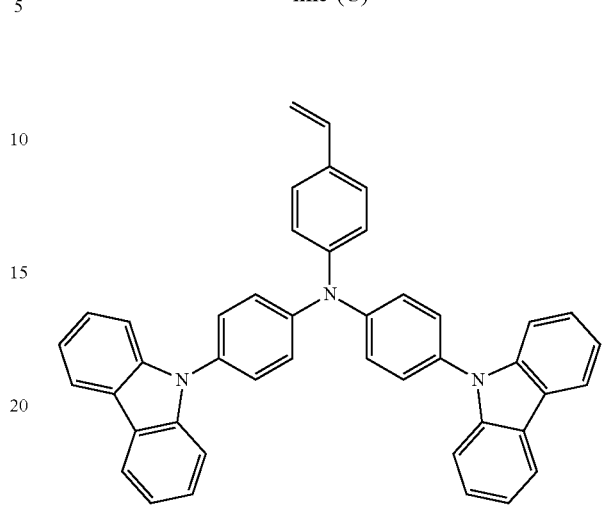

Prepared according to [1].

1-ethoxy-5-iodopent-1-yne (1)

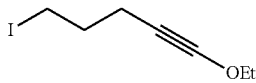

This synthesis was performed according to a modified procedure published by Hanna, R. & Daoust, B.: Intramolecular regioselective addition of radicals and carbanions to ynol ethers. A strategy for the synthesis of exocyclic enol ethers. *Tetrahedron* 67, 92-99 (2011) [2].

To a solution of ethoxyethyne (40 wt % in hexanes, 57 mmol, 1.25 equiv) in anhydrous THF (70 mL), n-BuLi (2.5 M, 63 mmol, 1.4 equiv) was added carefully at −78° C. After stirring for 1 h at −78° C., 1,3-dimethyl-3,4,5,6-tetrahydro-2(1H)-pyrimidinone (15 mL, 126 mmol, 2.75 equiv) was added and the brown solution stirred for further 30 minutes at this temperature. After the careful addition of 1,3-diiodopropane (13.6 g, 46 mmol, 1.00 equiv) diluted in anhydrous THF (10 mL), the reaction mixture was allowed to warm to RT and stirred at this temperature for 20 h and at 50° C. for additional 2 h. The reaction was quenched with saturated ammonium chloride solution (90 mL), extracted with Et$_2$O (3×100 mL) and washed with brine (3×100 mL). The combined organic phases were dried over Na$_2$SO$_4$, filtered and the solvent removed in vacuo. Purification by flash chromatography on silica with a gradient of n-heptane and EtOAc afforded the product (12.7 g, 48 mmol, 42% yield) as pale yellow oil.

$^1$H NMR (500 MHz, chloroform-d) δ 4.05 (q, 7.1 Hz, 2H), 3.32 (t, 6.8 Hz, 2H), 2.28 (t, 6.6 Hz, 2H), 1.95 (p, 6.7 Hz, 2H), 1.37 (t, 7.1 Hz, 3H).

$^{13}$C NMR (101 MHz, chloroform-d) δ 90.22, 77.48, 77.27, 77.16, 76.84, 74.15, 35.30, 33.17, 18.47, 14.50, 6.10.

1-((5-ethoxypent-4-yn-1-yl)oxy)-4-vinylbenzene (2) (ethoxyethinyl Monomer), (E)

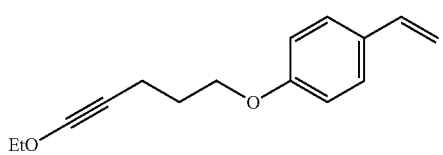 [SMILES: C=Cc1ccc(OCCCC#COCC)cc1]

A suspension of 1-ethoxy-5-iodopent-1-yne (1) (3.00 g, 12.6 mmol, 1.00 equiv), freshly deprotected 4-vinylphenol (2.80 g, 23.3 mmol, 1.85 equiv), and $K_2CO_3$ (1.00 g, 7.0 mmol, 1.20 equiv) in anhydrous DMF (25 mL), was stirred for 20 hours at 50° C. After completion (judged by TLC) the reaction mixture was diluted with EtOAc (50 mL), washed with brine (5×50 mL) and dried over $Na_2SO_4$ and filtrated. The filtrate was adsorbed on silica and purification by flash chromatography on silica with a gradient of n-heptane and ethyl acetate afforded the product (2.42 g, 10.5 mmol, 83% yield) as colorless oil.

$^1$H NMR (500 MHz, chloroform-d) [ppm] δ 7.36-7.32 (m, 2H), 6.89-6.84 (m, 2H), 6.66 (dd, J=17.6, 10.9 Hz, 1H), 5.60 (dd, J=17.6, 1.0 Hz, 1H), 5.12 (dd, J 10.9, 0.9 Hz, 1H), 4.06 (t, J=6.3 Hz, 2H), 4.02 (q, J=7.1 Hz, 2H), 2.33 (t, J=6.9 Hz, 2H), 1.96-1.90 (m, 2H), 1.33 (t, J=7.1 Hz, 3H).

$^{13}$C NMR (101 MHz, chloroform-d) [ppm] δ 159.0, 136.4, 130.5, 127.5, 127.5, 114.7, 111.6, 89.9, 74.1, 66.7, 29.4, 14.5, 14.1.

3,6-dibutoxy-9H-carbazole (2)

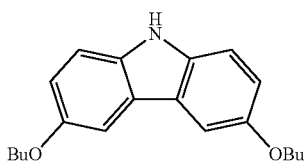

At RT, 57 mL absolute 1-butanol (154 mmol, 10.0 eq) were dropwise added under stirring to a suspension 11.1 g NaH (460 mmol, 10.0 eq) in dry DMF. After gas release ceased, the mixture was stirred for an additional hour and the resulting sodium butanolate solution was then, under inert atmosphere, added to a suspension 35.0 g CuI (18.0 mmol, 4 eq) in 50 mL dry DMF. The reaction mixture has been stirred at 120° C. for 1 h, filtered through diatomaceous earth and evaporated with silica. Column elution with n-hexane/ethyl acetate gradient afforded, after eluate evaporation, the desired product as a white solid.

Yield: 12.3 g (39.5 mmol, 86%)

$^1$H NMR (500 MHz; THF-ds) [ppm] δ 9.81 (s, 1H); 7.51 (d, J=2.4 Hz, 2H); 7.23 (dd, J=8.8 and 0.5 Hz, 2H); 6.94 (dd, J=8.7 and 2.4 Hz, 2H); 4.04 (t, J=6.5 Hz, 4H); 1.88-1.75 (m, 4H); 1.65-1.47 (m, 4H); 1.01 (t, J=7.4 Hz, 6H)

$^{13}$C NMR (126 MHz; chloroform-d) [ppm] δ 153.2; 135.4; 123.9; 115.9; 111.5; 104.1; 68.9; 31.74; 19.5; 14.1

4-(bis(4-(3,6-dibutoxy-9H-carbazol-9-yl)phenyl) amino) benzaldehyde (3)

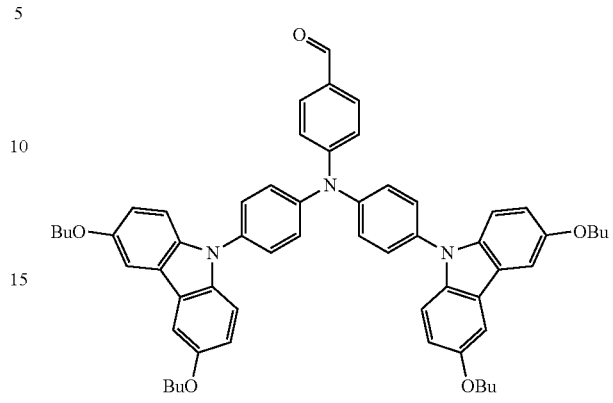

9.00 g 3,6-dibutoxy-9H-carbazole (2) (29.0 mmol, 2.4 eq), 6.30 g 4-(bis(4-iodophenyl)amino)benzaldehyde (29.0 mmol, 1.00 eq), 1.60 g copper bronze (25.0 mmol, 2.10 eq), 0.63 g [18]crown-6 (2.40 mmol, 0.20 eq) and 5.00 g $K_2CO_3$ (36.0 mmol, 3.00 eq) were stirred in 30 mL dry o-dichlorobenzene at 200° C. for 24 h. Then, the reaction mixture was diluted with 400 mL toluene, filtered through diatomaceous earth, the filtrate was three times washed with 100 mL brine, dried over sodium sulfate and vacuum evaporated to dryness. Recrystallization from toluene afforded the desired product as a yellowish solid.

Yield: 9.00 g (10.1 mmol, 84%)

$^1$H NMR (500 MHz; THF-ds) [ppm] δ 9.86 (s, 1H); 7.85-7.77 (m, 2H); 7.66-7.60 (m, 8H); 7.57-7.49 (m, 4H); 7.38 (d, J=8.9 Hz, 4H); 7.32-7.26 (m, 2H); 7.00 (dd, J=8.9 and 2.4 Hz, 4H); 4.09 (t, J=6.5 Hz, 8H); 1.85-1.79 (m, 8H); 1.64-1.49 (m, 8H); 1.02 (t, J=7.4 Hz, 12H)

$^{13}$C NMR (126 MHz; CDCl$_3$) [ppm] δ 190.6; 153.7; 153.1; 144.5; 136.2; 135.2; 131.7; 130.1; 127.9; 127.3; 123.9; 120.5; 115.9; 110.7; 104.1; 68.9; 31.7; 19.5; 14.1

4-(3,6-dibutoxy-9H-carbazol-9-yl)-N-(4-(3,6-dibutoxy-9H-carbazol-9-yl)phenyl)-N-(4-vinylphenyl) aniline (D)

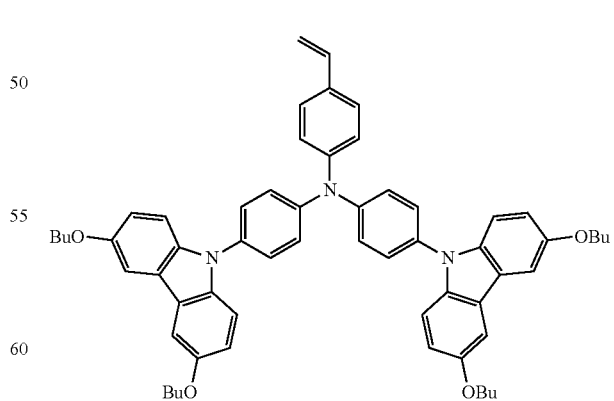

A suspension 9.60 g methyl triphenyl phosphonium bromide (26.9 mmol, 3 eq) and 2.9 g potassium tert-butoxide (26.1 mmol, 2.90 eq) in dry 1,4-dioxane has been stirred for 2 h at 0° C., then, 8.00 g 4-(bis(4-(3,6-dibutoxy-9H-carbazol-9-yl)phenyl)amino)benzaldehyde (4) (8.97 mmol, 1.00 eq) were added in form of a solution in 200 mL dry toluene, while maintaining the temperature 0° C., the mixture has been stirred at this temperature for further 30 min., washed three times with 300 mL brine, dried over sodium sulfate, filtered and vacuum evaporated with silica. After column elution with n-heptane:toluene (1:2 v/v) and eluate evaporation, the desired product was obtained as a white solid.

Yield: 7.23 g (8.12 mmol, 91%)

$^1$H NMR (500 MHz; THF-ds) [ppm] δ 7.64 (d, J=2.5 Hz, 4H); 7.56-7.46 (m, 10H); 7.46-7.41 (m, 4H); 7.36 (d; J=8.9 Hz, 4H); 7.31-7.27 (m, 4H); 7.02 (dd, J=8.9 and 2.4 Hz, 4H); 6.75 (dd, J=17.6 and 10.9 Hz, 1H); 5.75 (d, J=17.6 Hz, 1H); 5.19 (d, J=11.0 Hz, 1H); 4.10 (t, J=6.5 Hz, 8H); 1.87-1.82 (m, 8H); 1.62-1.54 (m, 8H); 1.04 (t, J=7.4 Hz, 12H)

$^{13}$C NMR (126 MHz, chloroform-d) [ppm] δ 153.4; 146.9; 146.0; 136.3; 133.0; 132.9; 129.0; 128.2; 127.6; 127.4; 124.9; 124.5; 123.5; 115.7; 110.6; 103.9; 68.8; 31.6; 19.4; 13.9

2-(perfluorophenyl)-7-(4'-vinyl-[1,1'-biphenyl]-3-yl) benzo[lmn][3,8]phenanthrolin-1,3,6,8(2H,7H)-tetraone (F)

7-(perfluorophenyl)-1H-isochromeno[6,5,4-def]isoquinoline-1,3,6,8(7H)-tetraone (LRT241)

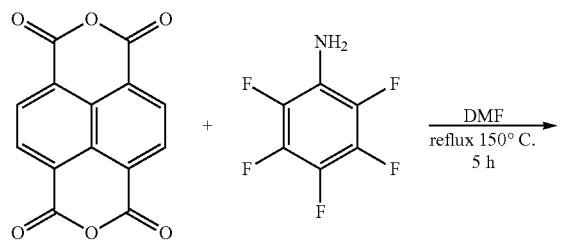

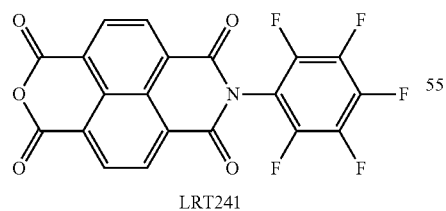

LRT241

To a suspension of naphthalene-1,4,5,8-tetracarboxylic dianhydride (6.43 g, 24 mmol) in DMF (150 mL) at 150° C. was added dropwise a solution of pentafluoroaniline (2.20 g, 12.00 mmol) in DMF (50 mL). Following addition, a clear dark-brown solution was obtained, which was further stirred at 150° C. for 5 hours until full consumption of pentafluoroaniline (determined by TLC). The reaction mixture was cooled down, and the reaction mixture was poured into water (500 mL). The resulting precipitate was recovered by filtration. The solid was dissolved in chloroform until a fine suspension is obtained. Filtration and concentration of the solution was followed by purification by silica-gel column chromatography using chloroform as eluent.

Yield: 4.00 g, 76%.

δ$_H$ (500 MHz, CDCl$_3$): 8.92 (2H, d, J=7.5 Hz), 8.89 (2H, d, J=7.6 Hz).

2-(3-bromophenyl)-7-(perfluorophenyl)benzo[lmn] [3,8]phenanthroline-1,3,6,8(2H,7H)-tetraone (LRT249)

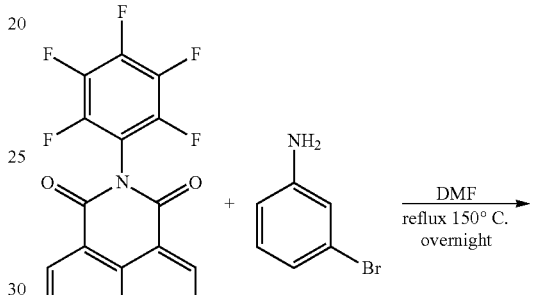

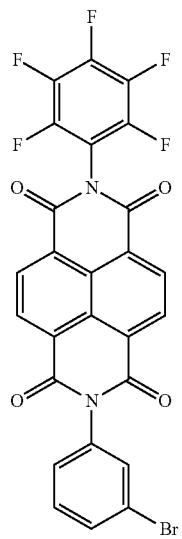

LRT249

To a solution of 7-(perfluorophenyl)-1H-isochromeno[6,5,4-def]isoquinoline-1,3,6,8(7H)-tetraone (4.00 g, 9.23 mmol) in DMF (50 mL) at 150° C., 3-bromoaniline (1 mL, 9.23 mmol) was added. The reaction was further heated at 150° C. overnight. Cooling down to room temperature was followed by addition of water (200 mL) and extraction with chloroform. The combined organic fractions were dried over MgSO$_4$. After filtration and concentration the crude product was purified by silica-gel column chromatography using heptane/ethyl acetate (4:1) as eluent.

Yield: 2.6 g, 47%.

$\delta_H$ (500 MHz, CDCl$_3$): 8.93-8.85 (4H, m), 7.69 (1H, d, J=1.7 Hz), 7.53 (1H, s), 7.48 (1H, t, J=8.0 and 8.0 Hz), 7.31 (1H, d, J=6.1 Hz).

Synthesis of 2-(perfluorophenyl)-7-(4'-vinyl-[1,1'-biphenyl]-3-yl)benzo[lmn][3,8]phenanthroline-1,3,6,8(2H,7H)-tetraone (LRT255, (F))

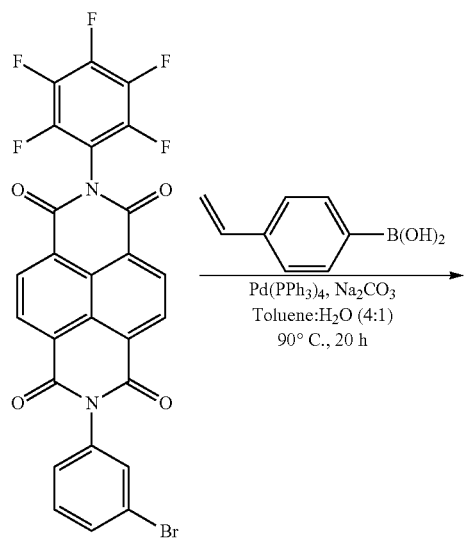

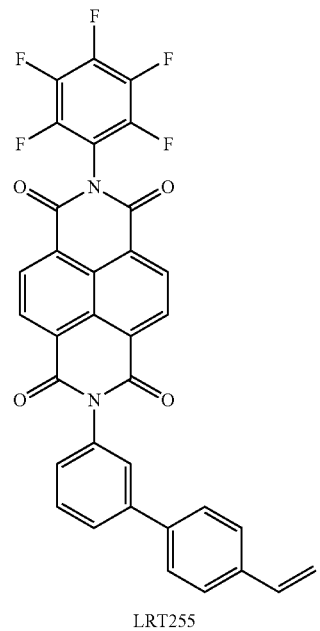

LRT255

4-Vinylphenylboronic acid (0.65 g, 4.41 mmol), 2-(3-bromophenyl)-7-(perfluorophenyl)benzo[lmn][3,8] phenanthroline-1,3,6,8(2H,7H)-tetraone (2.00 g, 3.39 mmol), sodium carbonate (1.44 g, 13.6 mmol) and tetrakis(triphenyl-phosphine)palladium(0) (0.20 g, 0.17 mmol) were dissolved in a toluene/water (2:1) mixture (150 mL) and heated for 20 hours at 100° C. After completion of the reaction the reaction was cooled to room temperature. Phase separation was followed by extraction with dichloromethane. The combined organic phases were dried over MgSO$_4$. The crude was purified on silica-gel column chromatography using toluene/acetone (95:5) as eluent. The product was recrystallized in methanol/dichloromethane mixtures.

Yield: 1.60 g (77%).

$\delta_H$ (500 MHz, CDCl$_3$): 8.89 (4H, d, J=6.6 Hz), 7.77 (1H, d, J=7.8 Hz), 7.66 (1H, t, J=7.8 and 7.8 Hz), 7.60 (2H, d, J=8.1 Hz), 7.56 (1H, s), 7.48 (2H, d, J=8.1 Hz), 7.32 (1H, d, J=7.7 Hz), 6.75 (1H, dd, J=17.6 and 10.9 Hz), 5.80 (1H, d, J=17.6 Hz), 5.29 (1H, d, J=10.9 Hz).

Functional Polymers poly[(N,N-bis(4-(9H-carbazole-9-yl)phenyl)-4-vinylaniline)$_{55}$-ran(1-(4-vinylphenyl)decane-1-one)$_{30}$-ran-(1-((5-ethoypent-4-yn-1-yl)oxy)-4-vinyl benzene)$_{15}$] FL241

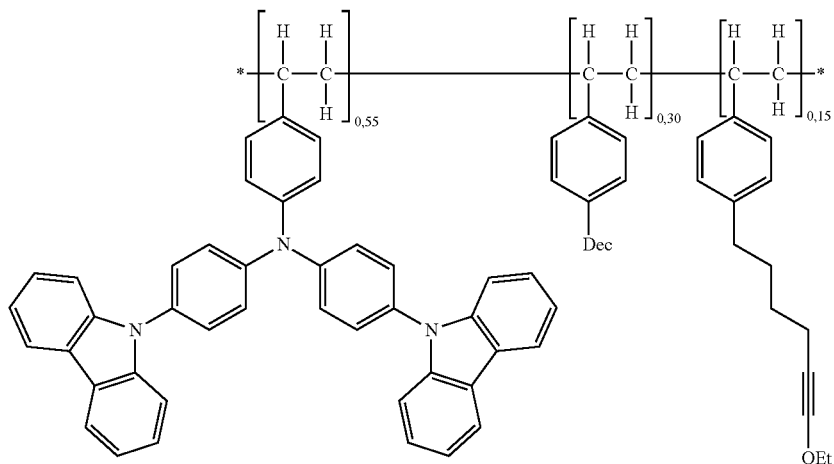

0.42 eq N,N-bis(4-(9H-carbazole-9-yl)phenyl)-4-vinylaniline (C), 0.40 eq 4-vinylphenyl decane and 0.25 eq 1-((5-ethoxypent-4-yn-1-yl)oxy)-4-vinylbenzene (E) were stirred with 0.02 eq azo-bis(isobutyronitrile) (AIBN) in THF at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 μm porosity), dried dissolved in THF to a solution having mass concentration 0.05 g/mL and reprecipitated. After drying, the desired product was obtained as a white solid in 56% yield.

$^1$H NMR (500 MHz, chloroform-d) [ppm] δ 8.25-7.65 (aromatic), 7.45-5.90 (aromatic), 4.10-3.30 (alkoxy), 2.60-0.60 (backbone+aliphatic), resulting co-monomer ratio $^1$H-NMR (m:n:o): 0.46:0.43:0.11, $M_w$=38.5 kg mol$^{-1}$, M=19.0 kg mol$^{-1}$.

Elemental analysis:
Measured C, 86.63; H, 6.54; N, 5.26; O, 1.56
Calculated (m=0.46, n=0.43, o=0.11): C, H, N, O poly(N$^1$-phenyl-N$^4$-(4-(phenyl(m-tolyl)amino)phenyl)-N$^1$-(m-tolyl)-N$^4$-(4-vinylphenyl)benzene-1,4-diamine)$_{79}$-ran-(1-((5-ethoxypent-4-yn-1-yl)oxy)-4-vinylbenzene)$_{21}$] FL262

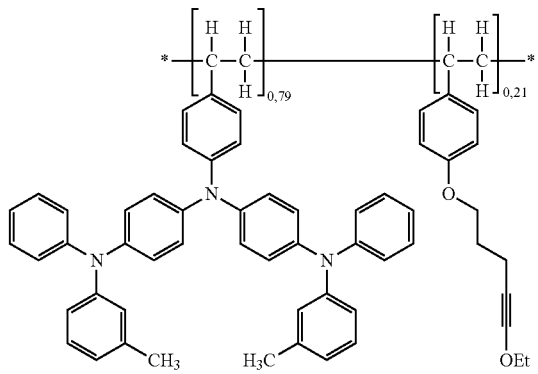

N$^1$-phenyl-N$^4$-(4-(phenyl(m-tolyl)amino)phenyl)-N$^1$-(m-tolyl)-N$^4$-(4-vinylphenyl)benzene-1,4-diamine (0.66 eq) (B)

and 0.33 eq 1-((5-ethoxypent-4-yn-1-yl)oxy)-4-vinylbenzene (E) were stirred with 0.02 eq azo-bis(isobutyronitrile) (AIBN) in THF at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 µm porosity), dried dissolved in THF to a solution having mass concentration 0.05 g/mL and reprecipitated. After drying, the desired product was obtained as a white solid in 50% yield.

$^1$H NMR (500 MHz, chloroform-d) [ppm] δ 8.40-5.20 (aromatic), 4.00-3.40 (alkoxy), 2.40-0.80 (aliphatic+backbone), resulting co-monomer ratio $^1$H-NMR (m:n): 0.79: 0.21, $M_w$=33.5 kg mol$^{-1}$, $M_n$=18.9 kg mol$^{-1}$.

Elemental analysis:
Measured C, 86.39; H, 6.34; N, 6.07; O, 1.20
Calculated (n=0.21): C, 86.38; H, 6.35; N, 6.05; O, 1.22 poly($N^4$-phenyl-$N^4$,$N^{4'}$-d-m-tolyl-$N^{4'}$-(4-vinylpenyl)-[1,1'-biphenyl]-4,4'-diamine)$_{76}$-ran-(1-((5-ethoxypent-4-yn-1-yl)oxy)-4-vinylbenzene)$_{24}$] FL253

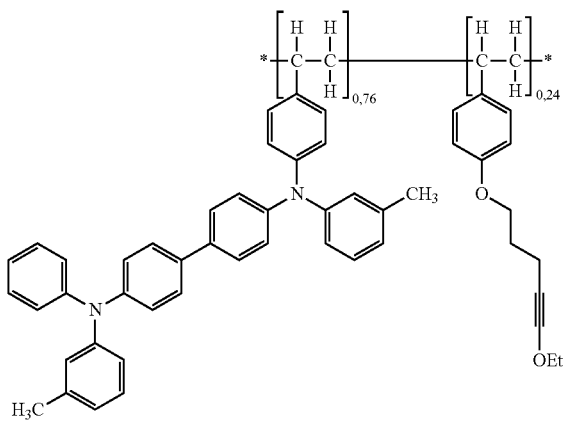

0.67 eq $N^4$-phenyl-$N^4$,$N^{4'}$-di-m-tolyl-$N^{4'}$-(4-vinylphenyl)-[1,1'-biphenyl]-4,4'-diamine (A) and 0.33 eq 1-((5-ethoxypent-4-in-1-yl)oxy)-4-vinylbenzene (E) were stirred with 0.02 eq azo-bis(isobutyronitrile) (AIBN) in THF at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 µm porosity), dried dissolved in THF to a solution having mass concentration 0.05 g/mL and reprecipitated. After drying, the desired product was obtained as a white solid in 57% yield.

$^1$H NMR (500 MHz, chloroform-d) [ppm] δ 7.40-6.20 (aromatic), 4.05-3.55 (alkoxy), 2.6-0.80 (aliphatic+backbone), resulting co-monomer ratio $^1$H-NMR (m:n): 0.76: 0.24, $M_w$=28.0 kg mol$^{-1}$, $M_n$=14.7 kg mol$^{-1}$.

Elemental analysis:

Measured C, 87.39; H, 6.55; N, 4.50; O, 1.79

Calculated (n=0.24): C, 87.30; H, 6.50; N, 4.55; O, 1.64 poly[(4-(3,6-dibutoxy-9H-carbazol-9-yl)-N-(4-(3,6-dibutoxy-9H-carbazol-9-yl)phenyl)-N-(4-vinylphenyl)aniline)$_{77}$-ran-(1-((5-ethoxypent-4-yn-1-yl)oxy)-4-vinylbenzene)$_{23}$] (FL272)

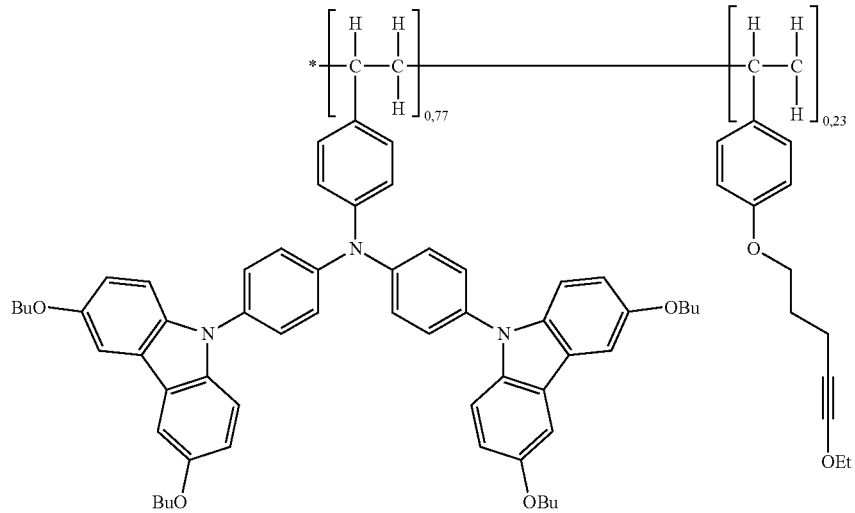

0.67 eq 4-(3,6-dibutoxy-9H-carbazol-9-yl)-N-(4-(3,6-dibutoxy-9H-carbazol-9-yl)phenyl)-N-(4-vinylphenyl)aniline (D) (0.67 equiv) and 0.33 eq 1-((5-ethoxypent-4-yn-1-yl)oxy)-4-vinylbenzene (E) were stirred with 0.02 eq azo-bis(isobutyronitrile) (AIBN) in toluene at overall mass concentration 0.1 g/mL for 72 h at 50° C., cooled to RT and the resulting polymer was precipitated from n-heptane:ethyl acetate 4:1 v/v mixture. The precipitate was collected using a PTFE filter (20 μm porosity), dried dissolved in toluene to a solution having mass concentration 0.05 g/mL and reprecipitated. After drying, the desired product was obtained as a white solid in 68% yield.

$^1$H NMR (500 MHz, chloroform-d) [ppm] δ 7.85-6.15 (aromatic), 4.29-3.40 (alkoxy), 2.48-0.55 (aliphatic+backbone), monomer ratio (m:n): 0.76:0.24, $M_w$=30.6 kg mol$^{-1}$, $M_n$=16.7 kg mol$^{-1}$.

Elemental analysis:
Measured C, 80.43; H, 7.16; N, 4.35; O, 7.74
Calculated (n=0.23): C, 80.76; H, 7.18; N, 4.38; O, 7.67 poly[(4-(3,6-dibutoxy-9H-carbazol-9-yl)-N-(4-(3,6-dibutoxy-9H-carbazol-9-yl)phenyl)-N-(4-vinylphenyl)aniline)$_{65}$-ran-(1-((5-ethoxypent-4-yn-1-yl)oxy)-4-vinylbenzene)$_{35}$] (FL293)

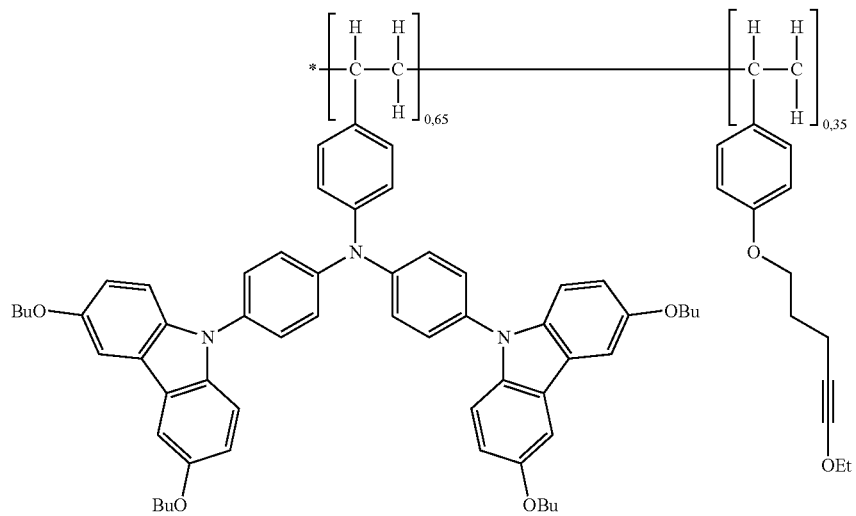

0.54 eq 4-(3,6-dibutoxy-9H-carbazol-9-yl)-N-(4-(3,6-dibutoxy-9H-carbazol-9-yl)phenyl)-N-(4-vinylphenyl)aniline (D) and 0.46 eq 1-((5-ethoxypent-4-yn-1-yl)oxy)-4-vinylbenzene (E) were stirred with 2×0.02 eq azo-bis(isobutyronitrile) (AIBN) in toluene at overall mass concentration 0.1 g/mL for 144 h at 50° C., cooled to RT and the resulting polymer was precipitated from n-heptane:ethyl acetate 4:1 v/v mixture. The precipitate was collected using a PTFE filter (20 μm porosity), dried dissolved in toluene to a solution having mass concentration 0.05 g/mL and reprecipitated. After drying, the desired product was obtained as a white solid in 68% yield. $^1$H NMR (500 MHz, chloroform-d) [ppm] δ 7.85-6.15 (aromatic), 4.29-3.40 (alkoxy), 2.48-0.55 (aliphatic+backbone), monomer ratio (m:n): 0.65:0.35, $M_w$=26.5 kg mol$^{-1}$, $M_n$=12.0 kg mol$^{-1}$.

Elemental analysis:
Measured C, 79.97; H, 7.34; N, 4.09, O 8.11
Calculated (n=0.35): C, 80.63; H, 7.22; N, 4.14, O 8.01 poly[(4-(3,6-dibutoxy-9H-carbazol-9-yl)-N-(4-(3,6-dibutoxy-9H-carbazol-9-yl)phenyl)-N-(4-vinylphenyl)aniline)₆₀-ran-(1-((5-ethoxypent-4-yn-1-yl)oxy)-4-vinylbenzene)₄₀] (FL298)

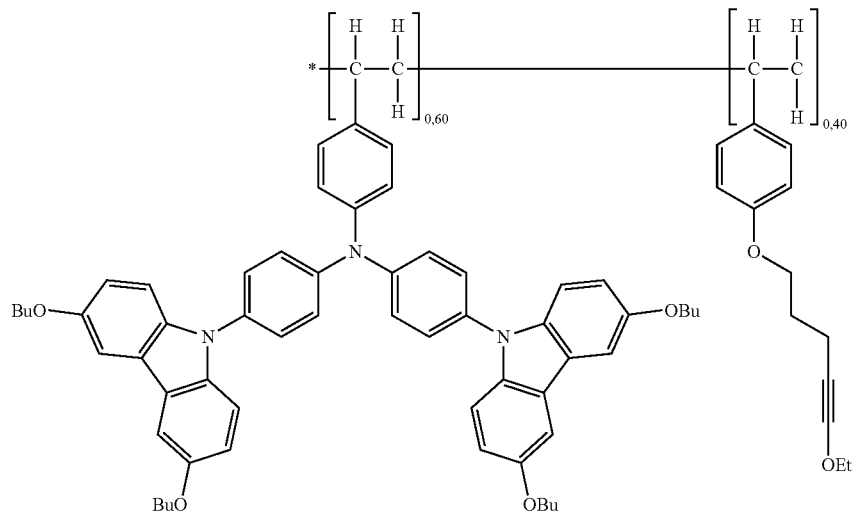

0.50 eq 4-(3,6-dibutoxy-9H-carbazol-9-yl)-N-(4-(3,6-dibutoxy-9H-carbazol-9-yl)phenyl)-N-(4-vinylphenyl)aniline (D) and 0.50 eq 1-((5-ethoxypent-4-yn-1-yl)oxy)-4-vinylbenzene (E) were stirred with 2×0.02 eq azo-bis(isobutyronitrile) (AIBN) in toluene at overall mass concentration 0.1 g/mL for 144 h at 50° C., cooled to RT and the resulting polymer was precipitated from n-heptane:ethyl acetate 4:1 v/v mixture. The precipitate was collected using a PTFE filter (20 μm porosity), dried dissolved in toluene to a solution having mass concentration 0.05 g/mL and reprecipitated. After drying, the desired product was obtained as a white solid in 74% yield.

¹H NMR (500 MHz, chloroform-d) [ppm] δ 7.85-6.15 (aromatic), 4.29-3.40 (alkoxy), 2.48-0.55 (aliphatic+backbone), monomer ratio (m:n): 0.60:0.40, $M_w$=22.7 kg mol⁻¹, $M_n$=11.9 kg mol⁻¹, Elemental analysis:

Measured C, 80.12; H, 7.27; N, 3.93; O, 8.32 Calculated (n=0.40): C, 80.56; H, 7.24; N, 4.03, O 8.18 poly[2-(perfluorophenyl)-7-(4'-vinyl-[1,1'-biphenyl]-3-yl)benzo[lmn][3,8]-phenanthroline-1,3,6,8(2H,7H)-tetraone-ran-1-((5-ethoxypent-4-yn-1-yl)oxy)-4-vinylbenzene] (LRT269)

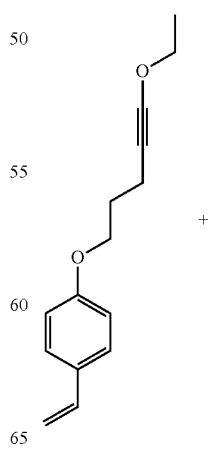

+

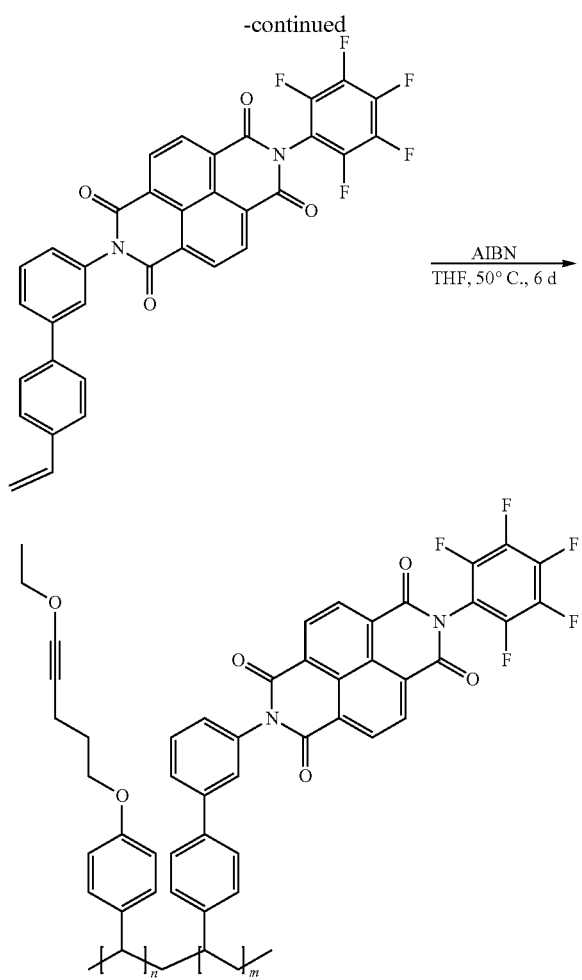

2-(perfluorophenyl)-7-(4'-vinyl-[1,1'-biphenyl]-3-yl)benzo[lmn][3,8]phenanthroline-1,3,6,8(2H,7H)-tetraone (F) (0.40 g, 0.66 mmol) and 1-((5-ethoxypent-4-yn-1-yl)oxy)-4-vinylbenzene (E) (0.17 g, 0.75 mmol, 30 wt %) and AIBN (4.6 mg, 2 mol %) were dissolved in 5.8 mL (100 g/L concentration) of THF. The reaction was carried out in a glove box system under nitrogen atmosphere at 50° C. for 72 hours. A second amount of AIBN was added (9.6 mg, 4 mol %) and the reaction was heated at 50° C. for 72 hours. After cooling to room temperature the reaction was quenched with methanol. Unreacted monomer was separated by repeated precipitation of the prepared polymer in methanol, wherein the precipitated solid was separated from mother liquors, dissolved in tetrahydrofuran, filtered through syringe PTFE filter 0.2 μm, the solution was concentrated and reprecipitated by pouring into methanol. The precipitate was filtered using PTFE membrane filters having pore size 0.45 μm. The polymer was dried overnight at 50° C. in vacuum. Yield: 75 mg.

The cross-linker content was estimated with DSC as 21.7 mol %; $M_w$=4.05 kg mol$^{-1}$, $M_n$=2.99 kg mol$^{-1}$. Conductivity and stability of a doped crosslinked layer 1) p-Doped Layer An anisole-acetonitrile 3:1 v/v solution containing 1.75% polymeric precursor FL253 and 0.44% p-dopant PR-7 was prepared and spin-coated on ITO substrate for 30 s at 1000 rpm. After drying and baking on hot plate in nitrogen atmosphere for 30 min at 180° C., conductivity and UV absorbance of the formed thin film at the wavelengths 340 nm (characteristic for charge transport structural moieties of the polymer) and 540 nm (characteristic absorption band of the active state of the p-dopant) were measured.

The formed films were spin-rinsed with toluene after 10 s soaking-time before spinning. After 30 min drying at 80° C., the thickness and conductivity were measured again.

The experiment has been repeated with $C_{60}F_{48}$ instead of PR-7 and with other exemplary precursor charge transport polymers. The results further amended with estimation of relative change in dopant absorbance after long-term illumination of the deposited layer with blue light are summarized in Table 2.

TABLE 2

| Material (weight ratio of selected precursor polymer and dopant given) | Dopant wash-out % | Polymer wash-off % | Conductivity before/after baking $10^{-6}$ S·cm$^{-1}$ | Dopant deterioration by blue light % |
|---|---|---|---|---|
| FL253:PR-7 4:1 | 1 | 2.0 | 40/4 | 0.1 |
| F253:C$_{60}$F$_{48}$ 4:1 | 6 | 1.0 | 9/1 | |
| FL241:PR-7 4:1 | 6 | 1.0 | 2/ | 1.0 |
| FL272:PR-7 4:1 | 6 | 0.5 | 52/ | 16 |
| FL293:PR-7 4:1 | 12 | 2.0 | 22/ | 0.4 |
| FL298:PR-7 4:1 | 11 | 0.1 | 3/ | 0.2 |

2) n-Doped Layer

A toluene solution containing 2.0% polymeric precursor LRT269 and 0.2% n-dopant ND-1 was prepared and spin-coated on ITO substrate for 30 s at 1000 rpm. After drying 30 min at 60° C. and activation of the dopant by 1 h irradiation with UV light (366 nm), the conductivity was measured first time. Baking on hot plate in nitrogen atmosphere for 20 min at 160° C. followed, and conductivity was measured again. The conductivity after crosslinking was $1.10^{-7}$ S·cm$^{-1}$, whereas the value observed before baking was $4.10^{-1}$ S·cm$^{-1}$.

The rinsing test showed complete crosslinking of the doped layer. The experiment confirmed that thermal crosslinking of alkoxyacetylene structural moieties does not interfere with n-doping in the chosen model electron transporting polymer LRT269.

Blue OLED

On 90 nm thick indium tin oxide (ITO) layer fabricated on a glass substrate, 50 nm thick crosslinked hole-transporting layer from the tested precursor polymer FL272 doped with 20 wt. % PR-7 based on the overall polymer weight was cast by spin-coating from 2 wt. % anisole-acetonitrile solution. After drying and baking in an inert atmosphere at 180° C. for 40 minutes, a doped crosslinked layer having thickness 40 nm was obtained. Following layers were prepared on top of the crosslinked layer by vacuum deposition: 90 nm undoped electron blocking layer composed from $N^4,N^{4'''}$-di(naphtalen-1-yl)-$N^4,N^{4'''}$-diphenyl-[1,1':4',1''-terphenyl]-4,4''-diamine, 20 nm blue fluorescent emitting layer composed of ABH113 (obtained from Sun Fine Chem (SFC), Korea) doped with NUBD370 (also from SFC, host:emitter ratio 95:5 by weight), 30 nm electron transporting layer composed of 2-(4-(9,10-di(naphtalen-2-yl)anthracen-2-yl)phenyl)-1-phenyl-1H-benzo[d]imidazole (CAS 561064-11-7) and lithium 8-hydroxyquinolinolate (CAS 850918-68-2) in weight ratio 1:1 and 100 nm thick Al cathode. At current density 15 mA/cm, the OLED prepared using the precursor polymer FL272 had, despite 2 h baking of the HTL, operational voltage 4.6 V and -quantum efficiency 5.2%. The lifetime of the OLED, expressed as LT97 (the time necessary for luminance decrease to 97% of its initial value), was 60 hours. The results, together with results of experiments with shorter baking time and with precursor polymer FL253, are summarized in Table 3.

TABLE 3

| material/<br>baking<br>duration<br>(min) | V<br>@15<br>mA/cm²<br>(V) | Qeff<br>@15<br>mA/cm²<br>(%) | CiEy | LT97<br>@15<br>mA/cm²<br>h | Operational<br>stability |
|---|---|---|---|---|---|
| FL272:PR-7 4:1 40 | 4.7 | 5.2 | 0.10 | 50 | yes |
| FL272:PR-7 4:1 120 | 4.6 | 5.2 | 0.10 | 66 | yes |
| FL253:PR-7 4:1 40 | 4.9 | 5.6 | 0.10 | 30 | yes |
| FL253:PR-7 4:1 120 | 5.5 | 5.7 | 0.10 | 30 | yes |

FIGS. 1 and 2 show current-voltage characteristics and lifetime of blue OLEDs prepared as described in Example, using baking time 40 minutes; curve (1), (circles), corresponds the OLED of the first row of the Table 3, curve (2), (stars) corresponds the third row.

The results summarized in Table 2 show that the conductivity of $10^{-6}$-$10^{-5}$ S/cm, as required for a hole transporting layer, was maintained in the doped layer after cross-linking. If the dopant was destroyed during the cycloaddition reaction, a significantly lower conductivity of about $10^{-10}$ S/cm would be obtained.

The OLED experiments summarized in Table 3 confirmed robustness of the inventive doped material, wherein efficiency and/or device-lifetime can be further increased by prolonged heat treatment of the doped layer, without a substantial change in spectral characteristics of the device (represented by the CIEy value which stands for y coordinate in colour space according to International Commission on Illumination) and without a substantial increase in operational voltage.

The results demonstrate that crosslinked charge transporting layers comprising semi-conducting material according to the invention can be successfully used in organic electronic devices.

The features disclosed in the foregoing description may, both separately and in any combination thereof, be material for realizing various embodiments of the invention which is generically defined in the independent claims.

The invention claimed is:
1. Charge transporting semi-conducting material comprising:
  a) at least one electrical dopant, and
  b) a branched or cross-linked charge-transporting polymer comprising cyclobutenone cross-linking units of at least one of the general formulae Ia and/or Ib,

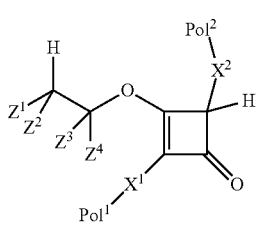

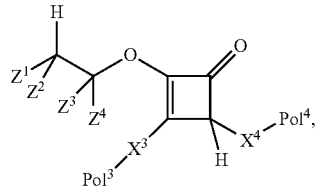

wherein
  aa) $Pol^1$, $Pol^2$, $Pol^3$ and $Pol^4$ are independently selected chains of the charge-transporting polymer,
  bb) $X^1$, $X^2$, $X^3$, and $X^4$ are independently selected optional spacer units or, independently, represent direct bonding of $Pol^1$, $Pol^2$, $Pol^3$ and $Pol^4$ chains to the cyclobutenone ring, and
  cc) $Z^1$, $Z^2$, $Z^3$, and $Z^4$ are independently selected from H, halogen or a carbon-containing group.

2. Charge transporting semi-conducting material according to claim 1, wherein the electrical dopant is a p-dopant or an n-dopant.

3. Charge transporting semi-conducting material according to claim 1, wherein the electrical dopant is selected from
  (i) [3]-radialene compounds, wherein each bridgehead carbon atom is substituted by a nitrile group, $C_6$-$C_{14}$ perfluorinated aryl or $C_2$-$C_{14}$ perfluorinated heteroaryl, wherein up to three fluorine atoms in the perfluorinated substituents may optionally be replaced by groups independently selected from nitrile or trifluoromethyl, and/or
  (ii) unsubstituted or substituted oxazolyl, diazolyl and/or thiazolyl radicals.

4. Electronic device comprising a semi-conducting layer comprising the charge transporting semi-conducting material according to claim 1.

5. A charge transporting semi-conducting material obtained by a process comprising:
  i) providing a solution containing
    aaa) at least one precursor charge transporting compound comprising at least one covalently attached alkinyloxy group having generic formula II

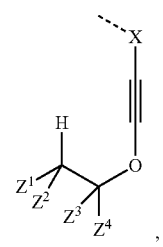

wherein
  X is an optional spacer which is further linked to a charge transporting structural moiety of the precursor charge transporting compound,
  the dashed line represents the bonding to a charge transporting structural moiety of the precursor charge transporting compound, and
  $Z^1$, $Z^2$, $Z^3$, and $Z^4$ are independently selected from H, halogen or the carbon-containing group,
    bbb) at least one electrical dopant,
    ccc) at least one solvent,

45 ii) depositing the solution on a substrate, iii) removing the solvent, and v) reacting the alkinyloxy groups to effect crosslinking, wherein the average number of the alkinyloxy groups per one molecule of the precursor charge transporting compound provided in the step i) is equal to or greater than 2.

6. Charge transporting semi-conducting material according to claim 5, wherein the precursor charge transporting compound is a precursor charge transporting oligomer or a precursor charge transporting small molecule.

7. Charge transporting semi-conducting material according to claim 5, wherein the precursor charge transporting compound is a charge transporting polymer which comprises ethylene building units substituted with at least one pending side group comprising at least one charge transporting structural moiety which comprises a conjugated system of at least 4 delocalized electrons.

8. Charge transporting semi-conducting material according to claim 5, wherein the charge transporting structural moiety is comprised in a carbocyclic or heterocyclic structural moiety.

9. Charge transporting semi-conducting material according to claim 8, wherein the charge transporting structural moiety comprises an aromatic system of delocalized electrons.

10. Charge transporting semi-conducting material according to claim 9, wherein the charge transporting structural moiety comprises at least two rings which are independently selected from aromatic and heteroaromatic rings.

11. Charge transporting semi-conducting material according to claim 5, wherein the charge transporting structural moiety comprises at least one trivalent nitrogen atom.

12. Charge transporting semi-conducting material according to claim 11, wherein the trivalent nitrogen atom is substituted with three carbocyclic or heterocyclic rings which are independently selected from aromatic and heteroaromatic rings.

13. Charge transporting semi-conducting material according to claim 5, wherein the charge transporting structural moiety is selected from the group consisting of

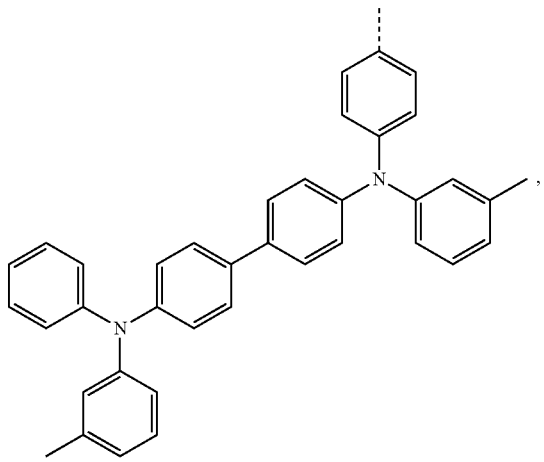

46

-continued

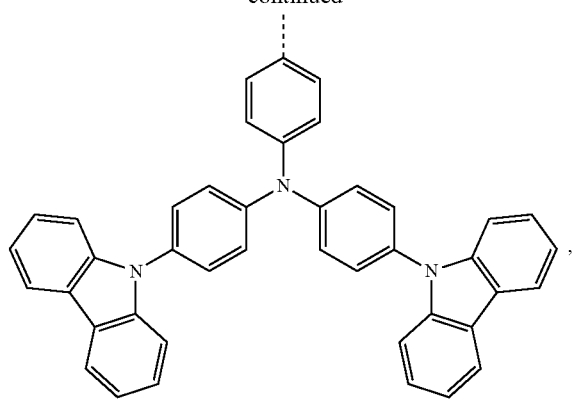

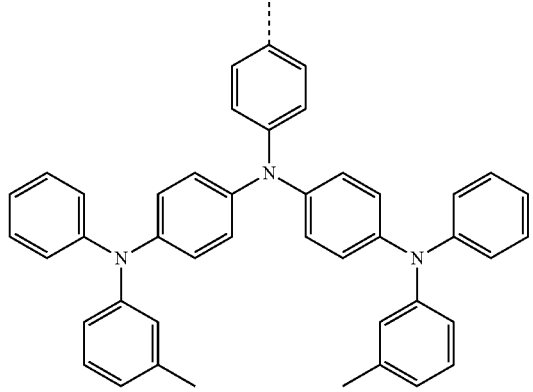

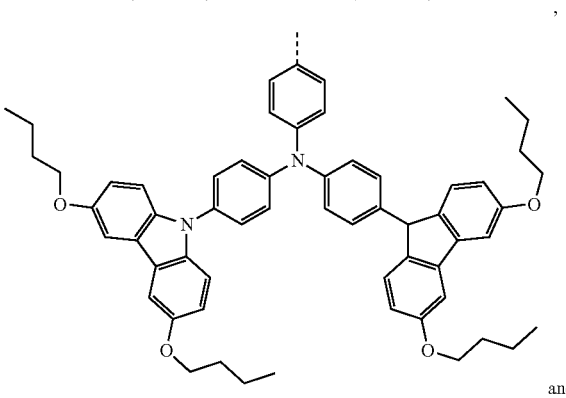

and

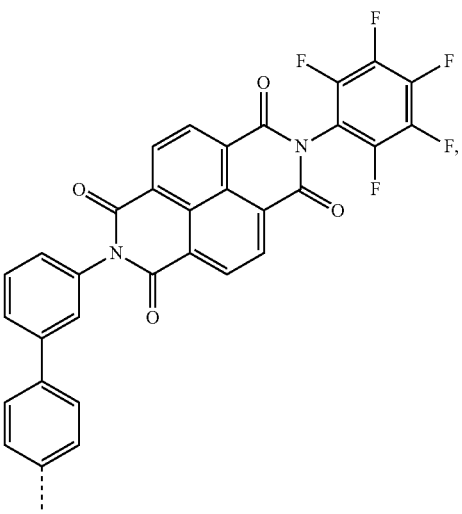

wherein the dashed line represents the covalent bond to the rest of the charge transporting polymer.

14. Crosslinked charge transporting polymer which is formed from the precursor charge transporting oligomer and/or from the precursor charge transporting small molecule as defined in claim 6.

15. Charge transporting semi-conducting material according to claim 5, wherein the average number of the alkinyloxy groups per one molecule of the precursor charge transporting compound provided in the step i) is equal to or greater than 2.05.

16. Charge transporting semi-conducting material according to claim 5, wherein the reacting of the alkinyloxy groups to effect crosslinking comprises heating.

17. Process for preparing a charge transporting semi-conducting material, the process comprising:
   i) providing a solution containing
      a) a precursor charge-transporting compound comprising at least one covalently attached alkinyloxy group having formula II

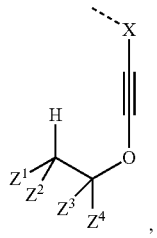

wherein
   X is the optional spacer which is further linked to a charge transporting structural moiety of the precursor charge transporting compound,
   the dashed line represents the bonding to the charge transporting structural moiety of the precursor charge transporting compound and
   $Z^1$, $Z^2$, $Z^3$, and $Z^4$ are independently hydrogen, halogen or a carbon-containing group,
      b) at least one electrical dopant,
      c) at least one solvent,
   ii) depositing the solution on a substrate,
   iii) removing the solvent, and
   iv) reacting the alkinyloxy groups to effect crosslinking,
      wherein the average number of the substituted alkinyloxy groups having formula II per molecule in the precursor charge transporting compound is equal to or greater than 2.

18. Process according to claim 17, wherein the average number of the alkinyloxy groups per one molecule of the precursor charge transporting compound provided in the step i) is equal to or greater than 2.05.

19. Process according to claim 17, wherein the reacting of the alkinyloxy groups to effect crosslinking comprises heating.

20. Solution comprising:
   a) a precursor charge-transporting compound comprising at least one covalently attached alkinyloxy group having formula II

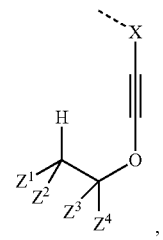

wherein
   X is the optional spacer which is further linked to a charge transporting structural moiety of the precursor charge transporting compound,
   the dashed line represents the bonding to the charge transporting structural moiety of the precursor charge transporting compound and
   $Z^1$, $Z^2$, $Z^3$, and $Z^4$ are independently hydrogen, halogen or a carbon-containing group,
   b) at least one electrical dopant, and
   c) at least one solvent.

21. Solution according to claim 20, wherein the solvent comprises at least 1 wt % of a nitrile compound.

* * * * *